(12) United States Patent
Sloey et al.

(10) Patent No.: US 8,974,126 B2
(45) Date of Patent: Mar. 10, 2015

(54) HYBRID OPTICAL CONNECTOR

(71) Applicant: Apple Inc., Cupertino, CA (US)

(72) Inventors: Jason S. Sloey, Cedar Park, TX (US); Albert J. Golko, Saratoga, CA (US); Eric S. Jol, San Jose, CA (US); Ian Spraggs, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/688,727

(22) Filed: Nov. 29, 2012

(65) Prior Publication Data

US 2013/0089290 A1 Apr. 11, 2013

Related U.S. Application Data

(63) Continuation of application No. PCT/US2011/038533, filed on May 31, 2011.

(60) Provisional application No. 61/350,430, filed on Jun. 1, 2010, provisional application No. 61/379,335, filed on Sep. 1, 2010.

(51) Int. Cl.
*G02B 6/36* (2006.01)
*G02B 6/42* (2006.01)
(Continued)

(52) U.S. Cl.
CPC ............ *G02B 6/4204* (2013.01); *G02B 6/3817* (2013.01); *G02B 6/4246* (2013.01); *G02B 6/4292* (2013.01); *G02B 6/262* (2013.01); *H01L 31/0232* (2013.01); *G02B 6/389* (2013.01)
USPC .......................................................... 385/93

(58) Field of Classification Search
CPC ...... G02B 6/32; G02B 6/3885; G02B 6/3853; G02B 6/3817; G02B 6/3825; G02B 6/4292; G02B 6/4204; G02B 6/4246; G02B 6/428; G02B 6/4284

USPC ....................................................... 385/74, 93
See application file for complete search history.

(56) References Cited

U.S. PATENT DOCUMENTS 5,872,999 A * 2/1999 Koizumi et al. ................ 710/72
5,930,428 A 7/1999 Irwin et al.
(Continued)

FOREIGN PATENT DOCUMENTS

DE 3109888 A1 9/1982
EP 1760630 A1 3/2007
(Continued)

OTHER PUBLICATIONS

International Preliminary Report on Patentability and Written Opinion mailed Dec. 13, 2012 in PCT Application No. PCT/US2011/038533, 14 pages.

(Continued)

*Primary Examiner* — Ryan Lepisto
(74) *Attorney, Agent, or Firm* — Kilpatrick Townsend & Stockton LLP

(57) ABSTRACT

Connector systems that carry electrical signals and optical signals in a single connector are provided. A male electro-optical connector can have an electrical insert portion that fits into a receptacle of a female electro-optical connector to provide a structural connection. The optical interface can be advantageously near a front of the connectors for easy maintenance. Optical connectors with a relatively large diameter for the optical interface are also provided. Optical connectors can include a collector for receiving optical signals at a large opening and providing signals to a photodiode at a small opening of the collector. Such optical connectors with a large diameter for an optical interface can advantageously provide reduced alignment tolerances. Adapters, cable adapters, docking stations, and other apparatus can also be provided.

13 Claims, 20 Drawing Sheets

(51) Int. Cl.
  *G02B 6/38* (2006.01)
  *G02B 6/26* (2006.01)
  *H01L 31/0232* (2014.01)

(56) References Cited

U.S. PATENT DOCUMENTS

| | | | |
|---|---|---|---|
| 6,101,307 | A | 8/2000 | Heimuller et al. |
| 6,588,943 | B1 | 7/2003 | Howard |
| 6,821,146 | B2 | 11/2004 | Tolmie |
| 7,572,071 | B1 | 8/2009 | Wu |
| 2003/0129872 | A1 | 7/2003 | Tolmie |
| 2009/0175582 | A1 | 7/2009 | Togami et al. |
| 2010/0046891 | A1 | 2/2010 | Sabo |
| 2010/0080563 | A1 | 4/2010 | DiFonzo et al. |
| 2010/0158448 | A1* | 6/2010 | Yi et al. ............ 385/74 |
| 2011/0096323 | A1 | 4/2011 | Liu et al. |
| 2013/0087690 | A1 | 4/2013 | Sloey et al. |

FOREIGN PATENT DOCUMENTS

| | | |
|---|---|---|
| EP | 2148230 A1 | 1/2010 |
| GB | 2106662 A | 4/1983 |
| JP | S58111008 A | 7/1983 |
| JP | H0667069 A | 3/1994 |
| JP | 2000357565 A | 12/2000 |
| JP | 2002023022 A | 1/2002 |
| KR | 1020080083889 A | 9/2008 |

OTHER PUBLICATIONS

International Search Report mailed Oct. 4, 2011, PCT/US2011/038533, 6 pages.
Partial Search Report for International PCT Application No. PCT/US2011/038533 (mailed with Invitation to Pay Fees), mailed Aug. 8, 2011, 8 pages.
International Search Report and Written Opinion mailed Jun. 12, 2012, PCT/US2011/038533, 21 pages.
Office Action for Chinese Patent Application No. 201110154996.8, mailed Jun. 27, 2013, 9 pages.
Office Action and Search Report for Chinese Patent Application No. 201110154996.8, mailed Dec. 19, 2013, 9 pages.
Office Action for Korean Patent Application No. 10-2012-7034340, mailed Dec. 19, 2013, 9 pages.
Office Action and Search Report for Taiwanese Patent Application No. 100119083, Dec. 26, 2013, 15 pages.
Office Action for Japanese Patent Application No. 2013-513267, Jan. 29, 2014, 8 pages.
Office Action for European Patent Application No. 11723215.7, Jan. 31, 2014, 4 pages.
Office Action for Japanese Patent Application No. 2013-513267, Aug. 20, 2014, 4 pages.
Office Action for European Patent Application No. 11723215.7, Sep. 4, 2014, 6 pages.
Office Action for Korean Patent Application No. 10-2012-7034340, mailed Oct. 30, 2014, 9 pages.

* cited by examiner

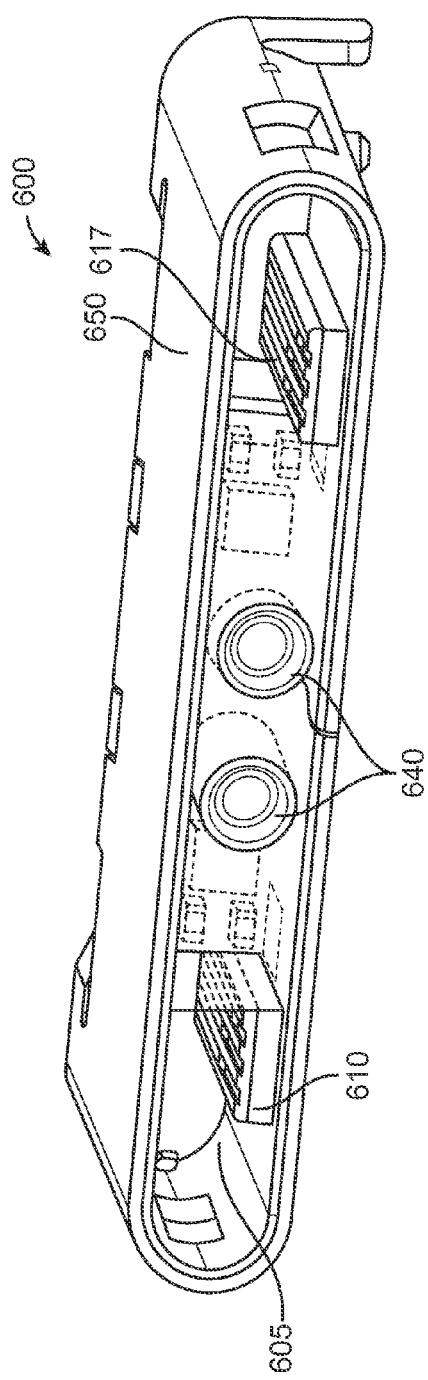
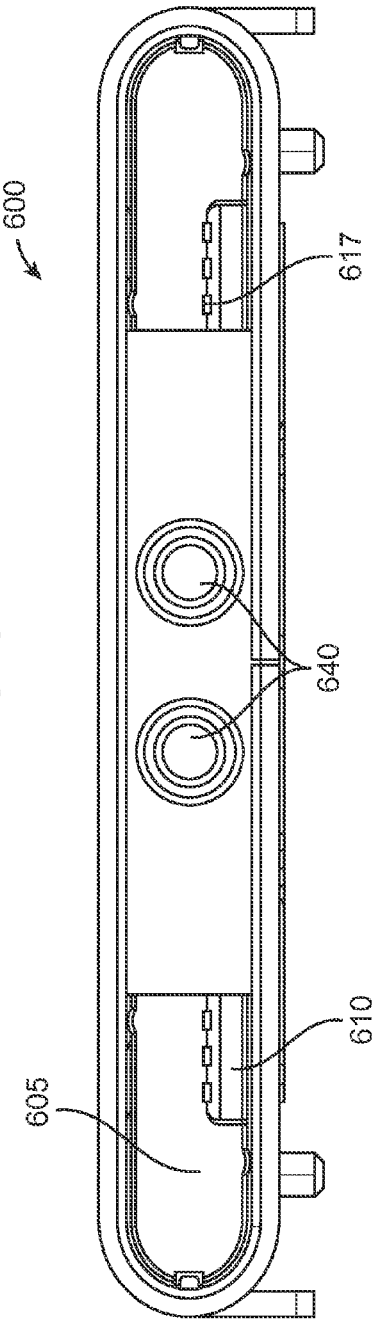
FIG. 6A
FIG. 6B

HYBRID OPTICAL CONNECTOR

CROSS-REFERENCES TO RELATED APPLICATIONS

This application is a Continuation of PCT Application No. PCT/US2011/038533, International Filing date May 31, 2011 which claims priority to U.S. Provisional Patent Application Nos: 61/350,430, entitled "Hybrid Optical Connector," by Jason Sloey, filed Jun. 1, 2010 and 61/379,335, entitled "Hybrid Optical Connector," by Sloey et al., filed Sep. 1, 2010, the entire contents of which are herein incorporated by reference for all purposes.

This application is related to the concurrently filed and commonly owned Continuation Patent Application entitled "Optical Connection of Devices" by Sloey, et al. the entire contents of which is herein incorporated by reference for all purposes.

BACKGROUND

The present invention relates generally to connectors and apparatus used to carry optical signals, and more specifically to connectors that can carry both optical and electrical signals and to optical connectors with advantageous properties.

Some devices, such as CD players, can output optical signals. Cables with optical connectors (e.g. Toslink) and with optical fiber carry these optical signals to another device (e.g. a stereo receiver). Optical signals have certain advantages, such as no electromagnetic interference. But optical signals also have limitations as to the functionality and support that can be provided. Current optical connectors also have limitations.

Therefore, it is desirable to have connectors that can carry optical signals as well as other signals. It is also desirable to have improved optical connectors that can have various advantageous properties, such as easily connected, easily maintained, and supporting high data rates.

SUMMARY

Accordingly, certain embodiments of the present invention can provide connector systems that carry electrical signals and optical signals in a single connector. An electro-optical connector can be made in a cost effective manner and for easy incorporation into electronic devices and apparatus. A male electro-optical connector can have an electrical insert portion that fits into a receptacle of a female electro-optical connector to provide a structural connection, thereby allowing the optical interface to be advantageously near a front of the connectors for easy maintenance.

Also, certain embodiments of the present invention can provide optical connectors with a relatively large diameter for the optical interface, while still providing high data rates (e.g. over 1 Gbps). Optical connectors can include a collector for receiving optical signals at a large opening and providing signals to an optical receiver at a small opening, where the optical receiver converts the optical signals to electrical signals. Optical connectors with a large diameter for an optical interface can also advantageously provide reduced alignment tolerances.

According to one embodiment, a female receptacle connector includes an insulator core, electrically conductive pins, and an active optical component. The pins are embedded in the insulator core. There are a first and a second set of pins. The first set of pins are designed to mate with electrical contacts of a corresponding connector. The active optical component is for receiving and/or transmitting optical signals to the corresponding connector. The second set of pins extend to a substrate that is attached to the active optical component. At least a portion of the second set of pins are communicably coupled with the active optical component and are configured to carry electrical signals corresponding to the optical signals. A lens device can extend from the at least one active optical component to a front of the connector, wherein the lens device carries optical signals to or from an optical device of the corresponding connector.

According to another embodiment, a method making a connector is provided. A lead frame is formed from a single piece of conductive material. The lead frame includes a carrier piece and a plurality of pins. The plurality of pins extend from the carrier piece, and include a first and a second set of pins. A substrate is attached to the second set of pins. The substrate has at least one active optical component for receiving and/or transmitting optical signals to a corresponding connector. At least a portion of the second set of pins are communicably coupled with the at least one active optical component and are configured to carry electrical signals corresponding to the optical signals. The first set of pins extend past the second set of pins toward a front of the connector for mating with electrical contacts of the corresponding connector.

According to another embodiment, a male plug connector includes an insulator core and at least one optical device. The insulator core has an insert portion that extends from a base of the insulator core. The insert portion is configured to fit inside a receptacle portion of a corresponding female connector. The insert portion has a plurality of contact locations. The at least one optical device is for receiving and/or transmitting optical signals to the corresponding female connector. A front end of the at least one optical device is on the base of the insulator core at a location separate from the insert portion.

A better understanding of the nature and advantages of the present invention may be gained with reference to the following detailed description and the accompanying drawings.

BRIEF DESCRIPTION OF THE DRAWINGS

FIG. 6A is a perspective view of a female connector capable of communicating electrical and optical signals according to embodiments of the present invention.

FIG. 6B is a front view of the female connector capable of communicating electrical and optical signals according to embodiments of the present invention.

FIG. 20A is a simplified perspective view of a connector insert for hybrid male plug connector 50, while

DETAILED DESCRIPTION

Certain embodiments can provide connector systems that carry electrical signals and optical signals in a single connector. An electro-optical connector can be made in a cost effective manner and for easy incorporation into electronic devices and apparatus. A male electro-optical connector can have an electrical insert portion that fits into a receptacle of a female electro-optical connector to provide a structural connection, thereby allowing the optical interface to be near a front of the connectors for easy maintenance.

Also, certain embodiments can provide optical connectors with a relatively large diameter for the optical interface, while still providing high data rates (e.g. over 1 Gbps). Optical connectors can include a collector for receiving optical signals at a large opening and providing signals to an optical receiver at a small opening, where the optical receiver converts the optical signals to electrical signals. Optical connectors with a large diameter for an optical interface can also advantageously provide reduced alignment tolerances.

I. Overview

Figure 1:
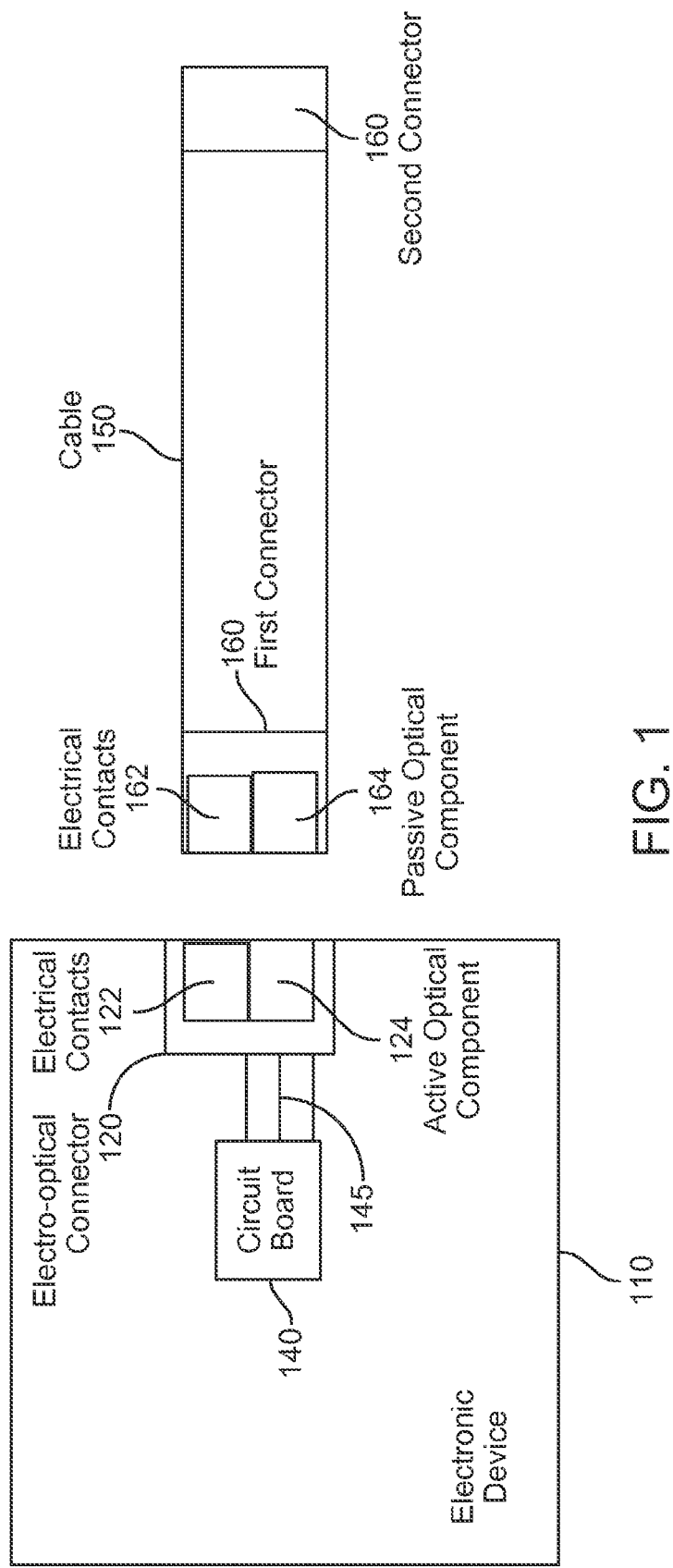
FIG. 1 is a block diagram illustrating a connector system for communicating optical and electrical signals according to embodiments of the present invention.

FIG. 1 is a block diagram illustrating a connector system 100 for communicating optical and electrical signals according to embodiments of the present invention. Having electrical signals can allow legacy support for older interface standards. Electrical signals can also provide power to electronic devices. Note that FIG. 1 is not drawn to any particular scale.

Electronic device 110 includes an electro-optical connector 120, which may be any female connector as described herein. Electronic device 110 may be any device that sends or receives data (e.g. audio or video). For example, electronic device 110 may be a media player that sends audio and video signals to another device for displaying the video and playing the audio. Electro-optical connector 120 may be a female or male connector, or have aspects of both.

Electro-optical connector 120 includes electrical contacts 122 and an active optical component 124. Electrical contacts 122 can receive and send electrical signals directly from electrical contacts of a corresponding connector as can occur in a purely electrical connector. Active optical component 124 converts electric signals from the electronic device into optical signals and/or converts optical signals received from another device into electrical signals that are usable by the electronic device. In various embodiments, the active optical component can be an optical transmitter, an optical receiver, or an optical transceiver that includes both an optical transmitter and an optical receiver in a single. Electro-optical connector 120 can have any number of active optical components and may include lens devices for transferring light to active optical component 124 (or active optical component 124 may include such lens devices). In one embodiment, electro-optical connector 120 has two separate active optical components, one for transmitting and one for receiving.

Electrically conductive pins 145 can travel from a circuit 140 to connector 120. A first set of pins 145 can carry electrical signals to be converted by active optical component 124, or receive electrical signals that result from optical signals being converted to electrical signals. Thus, in once aspect, electronic device 110 (e.g. through circuit board 140) can receive electrical signals in a same manner as for a purely electrical connector. Accordingly, electronic device 110 could be built the same for electrical, optical, or electro-optical connectors. A second set of pins 145 can carry electrical signals from circuit board 140 to electrical contacts 122. In one embodiment, electrical contacts 122 are part (e.g. a front end) of the second set of pins 145.

Electro-optical connector 120 can receive signals from a first connector 160 of cable 150. First connector 160 may be any male connector as described herein. Cable 150 has optical fibers (e.g. glass or plastic fibers) for carrying optical signals to or from electro-optical connector 120. A passive optical device 164 of first connector 160 can receive or carry the optical signals to active optical component 124, or to a lens device of connector 120 that is optically coupled with active optical component 124. Optical device 164 is passive in that the optical signals are not converted to/from electrical form, but stay in optical form while being carried. In one embodiment, passive optical device 164 can be an extension of an optical fiber or an additional device such as a lens.

Cable 150 can also have electrical wires for carrying electrical signals. Electrical contacts 162 connect with electrical contacts 122 when first connector interface 160 is mated with connector 120. In one embodiment, electrical contacts 162, and at least part of a housing (an insulator core) in which contacts 162 are embedded, are used to provide alignment for the optical interface. For example, electrical contacts 162 can fit inside connector 120 to provide alignment of active optical component 124 and passive optical device 164. Such alignment can allow the optical devices to be at a front of the connectors.

Having the optical devices at a front of a connector can allow easy cleaning and maintenance of the optical interface. For example, active optical component 124 may be coupled with passive elements (e.g. a lens and/or a collector) that are also part of connector 120. The passive elements can lie between passive optical device 164 and active optical component 124. These passive elements can be maintained easier when they lie at a front of connector 120.

In an embodiment with a single active optical component, the component can be a transceiver. In this embodiment, different optical frequencies (e.g. wavelength of 850 nm in one direction and 1350 nm in the other) can be used. Filters or other mechanisms can be used to reduce optical cross talk, e.g., by blocking light from the transmitting part to the receiving part.

In some embodiments, cable 150 has two fiber channels, one for each direction of transmission. Each of these channels can be a multi-core fiber, where multiple fibers transmit light in the same direction. For example, the total diameter can be 200-500 microns, with each fiber having a diameter of about 50-100 microns (e.g. 300 total diameter and 100 individual diameters). A multi-core fiber can provide low light loss when bent (e.g. due to the small individual fibers), and the total diameter can provide a large total area for light transmission, which can help with alignment at the connectors. In one embodiment, the total diameter of a multi-core fiber is about the same value as the diameter of receiving lens on connector 120.

In one embodiment, active optical component 124 may work with electromagnetic radiation at a specific wavelength, but any wavelength may be chosen. For example, a wavelength of 650 nm may be used when plastic fibers are to be used in cables, and a wavelength of 850 nm may be used when glass fibers are to be used, as these wavelengths have low loss for these respective materials. But 850 nm may also be used for plastic fibers when cables are not expected to be long (e.g. 5 m or less).

Figure 2A:
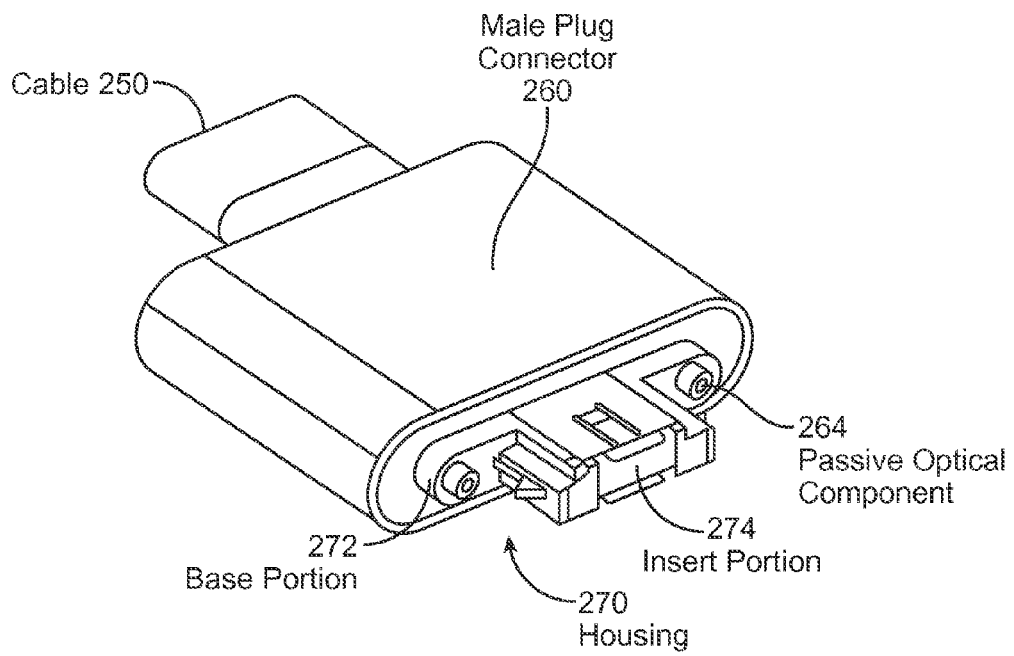
FIG. 2A shows a male plug connector at an end of a cable for communicating optical and electrical signals according to embodiments of the present invention.

FIG. 2A shows a male plug connector 260 at an end of a cable for communicating optical and electrical signals according to embodiments of the present invention. In one embodiment, male plug connector can correspond to first connector interface 160.

Cable 250 includes male plug connector 260 for sending and receiving optical signals and electrical signals. Housing 270 includes an insert portion 274 and base portion 272. Electrical signals can be provided with electrical contacts at contact locations in insert portion 274 of housing 270. The electrical contacts can be embedded in the insert portion, e.g., embedded so that the housing surrounds the contacts or embedded in an inner surface, thereby forming the contacts on the inner surface. Base portion 272 can include a passive optical component 274 for carrying optical signals. In one embodiment, base portion 272 is made integral with insert portion 274. In another embodiment, base portion 272 is a separate piece from insert portion 274.

In various embodiments, passive optical device 274 can be an extension of an optical fiber in cable 250 or an additional device such as a lens. In one embodiment, male plug connector 260 can also include an active optical component, and thereby can have only electrical wires, and no optical fibers. In one embodiment, the electrical contacts and electrical wires may be omitted when only optical signals are to be carried. In instances where cable 250 is only to transfer electrical signals, passive optical component may be omitted, or just not connected with any optical fibers as the cable would not have any. The other end of such a cable could be any standard electrical connector, e.g., USB.

Figure 2B:
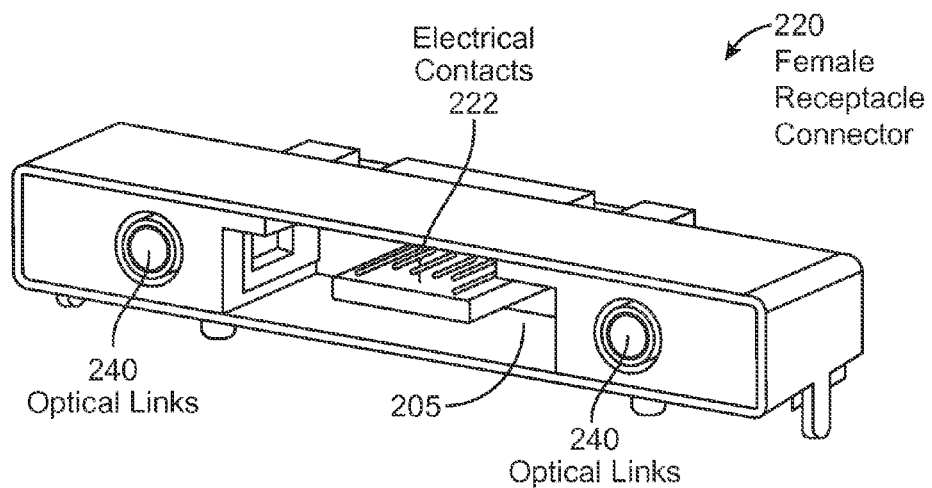
FIG. 2B shows a female receptacle connector for communicating optical and electrical signals according to embodiments of the present invention.

FIG. 2B shows a female receptacle connector 220 for communicating optical and electrical signals according to embodiments of the present invention. The connection of male plug connector 260 to female connector 220 can provide communication of both electrical and optical signals. The electrical signals can be communicated via electrical contacts in insert portion 274 of male plug connector, which can contact with electrical contacts 222 when the connectors are mated. Electrical contacts 22 (e.g. acting as a front end of a pin) can transmit the electrical signals to pins at a back end of the female connector 220, and then to a circuit board to which the pins can be electrically connected (e.g. soldered). The optical signals can be communicated via passive optical components 264 to optical links 240. In various embodiments, the passive optical components 264 can include a lens optically coupled with a fiber or the front end of a fiber, where the front end can be polished.

Insert portion 244 of housing 240 can fit (at least partially) inside opening 205 of female connector 220. The insertion of insert portion 244 can provide a structural connection between male plug connector 260 and female connector 220. This structural connection can provide alignment of optical links 240 with passive optical components 264.

An optical link of optical links 240 can include an active optical component and passive optical components. In one embodiment, one optical link can include one active optical component (e.g. in the optical link on the left) for transmitting optical signals and the other optical link can include another active optical component (e.g. in the optical link on the right) for receiving optical signals. Passive optical components (e.g. a lens) can carry the light from a front of female connector 220 to the active optical component.

In embodiments where the optical links 240 have a lens that is at the front of the connector (e.g., within 1 cm of the front edge or less than ¼ the depth of opening 205), optical links 240 can be easily maintained. For example, any debris on the lens can be brushed away. Also, the external surface of the lens can be cleaned and/or polished to provide good transmission of optical signals. In one aspect, the use of insert portion 274 to provide structural connection and broad alignment allows a surface of optical links to be near the front edge of connector 220.

In another embodiment, optical links 240 can be on one side and the electrical pins could be on the other side. In yet another embodiment, electrical contacts 222 can be separated and at the edges, with optical links 240 in the middle.

II. Female Hybrid Connector with Centered Optical Elements

Figure 3:
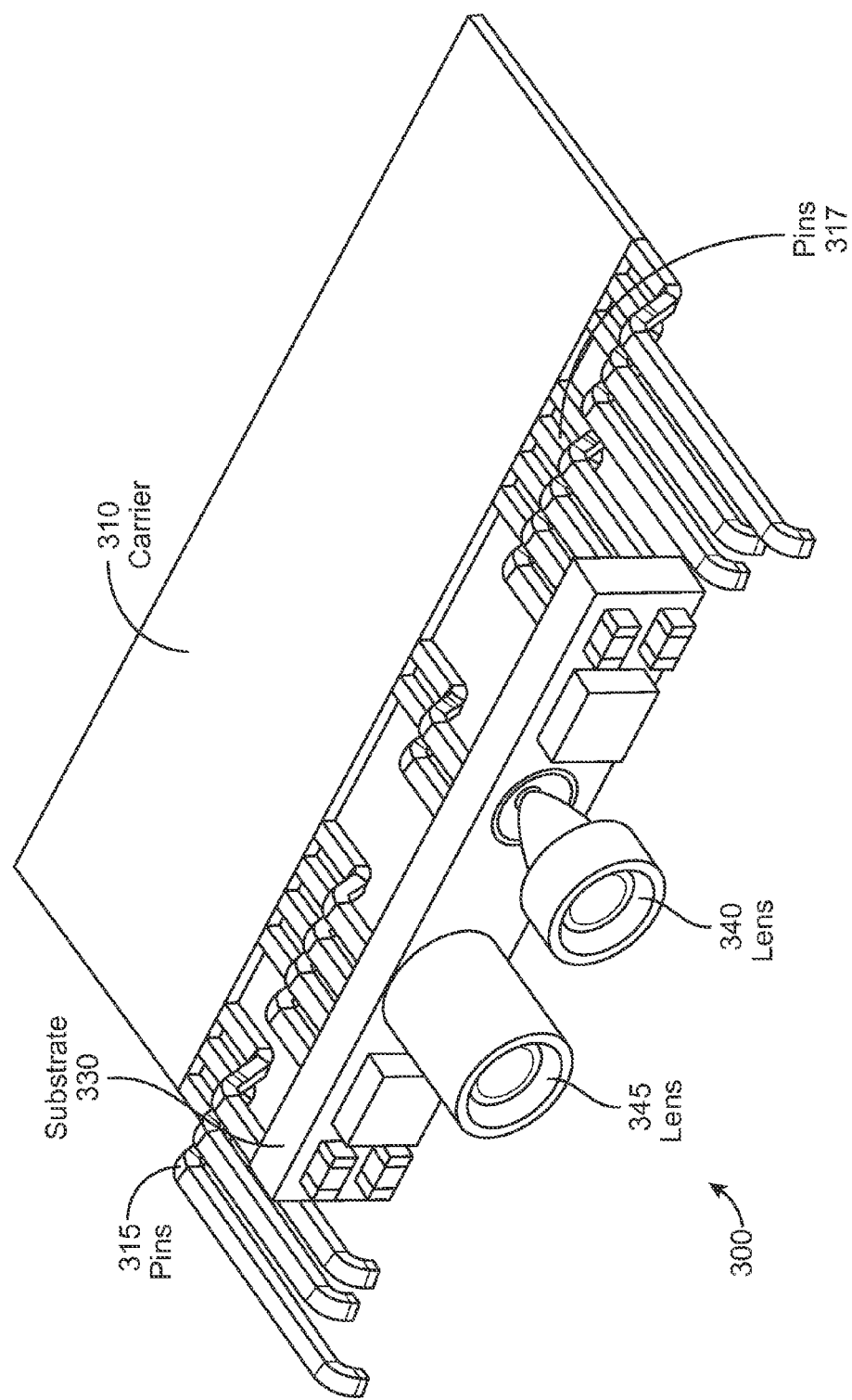
FIG. 3 shows a lead frame for a female connector that has electrical components for converting between electrical signals and optical signals according to embodiments of the present invention.

FIG. 3 shows a lead frame 300 for a female connector that has electrical components for converting between electrical signals and optical signals according to embodiments of the present invention. As shown, lead frame 300 is at an intermediate point of manufacturing. As shown, lead frame has optical elements in the center. Examples of an optical element include a fiber, lens, collector, or active optical component. Other embodiments herein (e.g. female receptacle connector 220 can have the optical elements at the edges). Embodiments with optical elements at the edges can have intermediate stages that are similar to lead frame 300.

Carrier 310 holds the pins 315 and 317. Carrier 310 and pins 315 and 317 can be made of an electrically conductive material (e.g. copper). Both sets of pins can carry electrical signals, but pins 315 are configured to carry electrical signals to/from electrical contacts of a corresponding connector. Pins 317 are configured to carry electrical signals to/from active optical components on substrate 320. Substrate 330 includes active optical components and lenses 340 and 345. Lenses 340 and 345 receive and transmit light to optical devices (e.g. lenses) of the corresponding connector.

Although 16 total pins are shown, there can be any number of total pins, which can be split up in any manner between pins 315 and pins 317. Pins 315 and 317 can correspond to pins 145 of FIG. 1. As used herein, the term "pin" is used to refer to a conductive material that can carry electrical signals. Part of the pins can come in contact with pins of another connector, and these pins (e.g. pins 315) may also be called contacts.

Pins 317 eventually can be connected with a circuit board (e.g. circuit board 140 of FIG. 1) and communicate electrical signals to the circuit board, where the electrical signals correspond to optical signals (i.e. converted from or to be converted into the optical signals). The same circuit board can also be connected with pins 315 and can receive electrical signals on pins 315, wherein the electrical signals are received from electrical contacts of the corresponding connector.

In one embodiment, the back ends of pins 315 and 317 can lie in a single row. After carrier 310 is cut away, a circuit board can be positioned in a similar manner to carrier 310. Thus, the circuit board can lie behind the connector, thereby allowing the electronic device to be thinner. Also, having the pins in a single row can allow a connection of the pins to an edge of the circuit board, thereby allowing the circuit board to be smaller.

Figure 4:
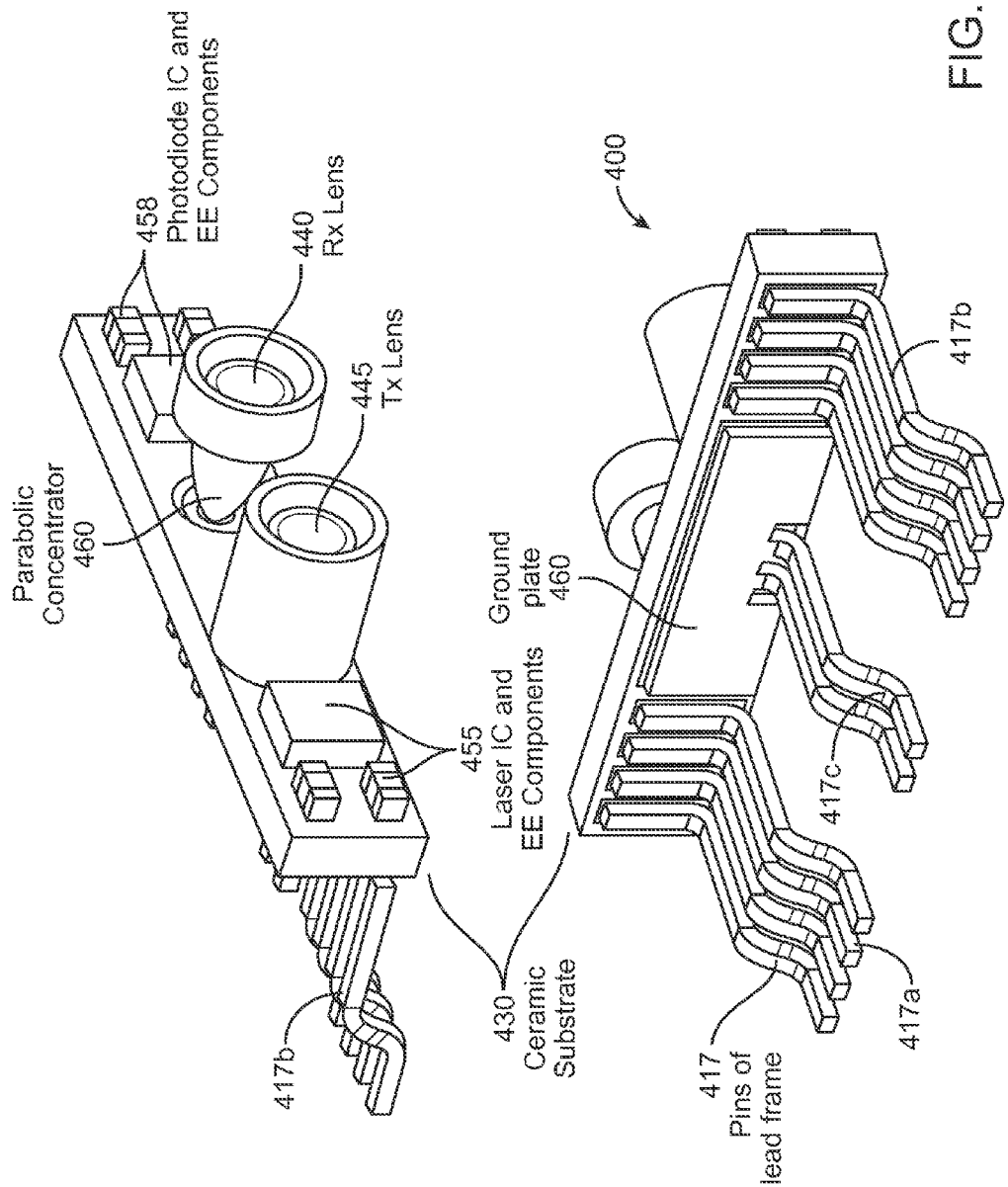
FIG. 4 shows pins of a lead frame assembly attached to a substrate having at least one active optical component according to embodiments of the present invention.

FIG. 4 shows pins 417 of a lead frame assembly 400 attached to a substrate 430 having at least one active optical component according to embodiments of the present invention. Lead frame assembly 400 includes active optical components and pins 417 that carry the electrical signals to/from the active optical components. In one embodiment, lead frame assembly 400 corresponds to the substrate 330 and attached components of FIG. 3.

A substrate 430 is attached to pins 417. For example, pins 417 can be electrically bonded (e.g. soldered) to a pad on the back of substrate 430. Pins 417b can send signals to substrate 430. In one embodiment, the signals on pins 417b can include power, ground, and two data signals (e.g. data signals). Traces in substrate 430 can send the electrical signals to a laser integrated circuit (IC) and other electrical components 455. In one embodiment, laser IC and EE components 455 can be put onto one IC as opposed to multiple ICs.

Laser IC and EE components 455 can convert the electrical signals to signals that drive an optical transmitter (e.g. a laser). The drive signals can include power, ground, and one data signal. The power signal can be refined, if necessary, to provide a proper power and voltage to the optical transmitter. In one embodiment, the optical transmitter can be behind the transmission lens 445. The optical transmitter can then provide optical signals to transmission lens 445, and transmission lens 445 can then provide the converted optical signals to a corresponding lens.

A receiving lens 440 can receive optical signals from the corresponding connector. A collector (e.g. parabolic concentrator 460) can collect the light and provide the light to an optical receiver (e.g. a photodiode), which converts the optical signals into electrical signals. A photodiode IC and EE components 458 can receive the electrical signals and modify them to conform to specifications of the electronic device in which pins 417a are connected. Photodiode IC and EE components 455 can be put onto one IC or onto multiple ICs.

In some embodiments, IC and EE components 458 can include a transimpedance amplifier (which converts photocurrent to electrical current) and limiting amplifier. The limiting amplifier can take electrical current and convert it into a voltage signal. The voltage signal can then be provided to a circuit board on pins 417a to provide the proper data that was originally conveyed in the received optical signals.

In one embodiment, middle pins 417c can also provide ground to substrate 430. The ground can be used for devices on the substrate and/or for shielding of certain devices. For example, ground plate 460 can provide shielding of the active optical components on the back of substrate 430. Ground plate 460 can be created at the same time that pins 417 are stamped.

For DisplayPort or other formats that have multiple signals (channels), the electrical signals on pins 417a or 417b could be combined and put into a single line before being sent to the substrate assembly (substrate 420 and attached devices). In another embodiment, electronics on the substrate could perform the combining (e.g. in components 455).

In one embodiment, the substrate assembly is created before being attached to pins 417. For example, components 455 and 458 can be attached to substrate 430 before it is attached to pins 417. For example, components 455 and 458 can be bonded (e.g. to pads) on the front of substrate 430, which can have traces that carry signals between the components.

In another embodiment, the substrate is ceramic for providing high insulation between electronic components to keep capacitive coupling low. Ceramic material can be molded, and then components attached. Ceramic molding can reduce capacitive coupling between the differential signals going into laser IC and EE components 455, or the differential signal coming out of photodiode IC and EE components 458. Some embodiments can provide up to 10 gigabit/second throughput. There is no electromagnetic interference for optical signals, but after conversion to electrical signals, electromagnetic interference and crosstalk can exist. As the ceramic has a high dielectric constant, the electrical components can be placed closer together and the traces in the ceramic can be placed closer together.

Figure 5A:
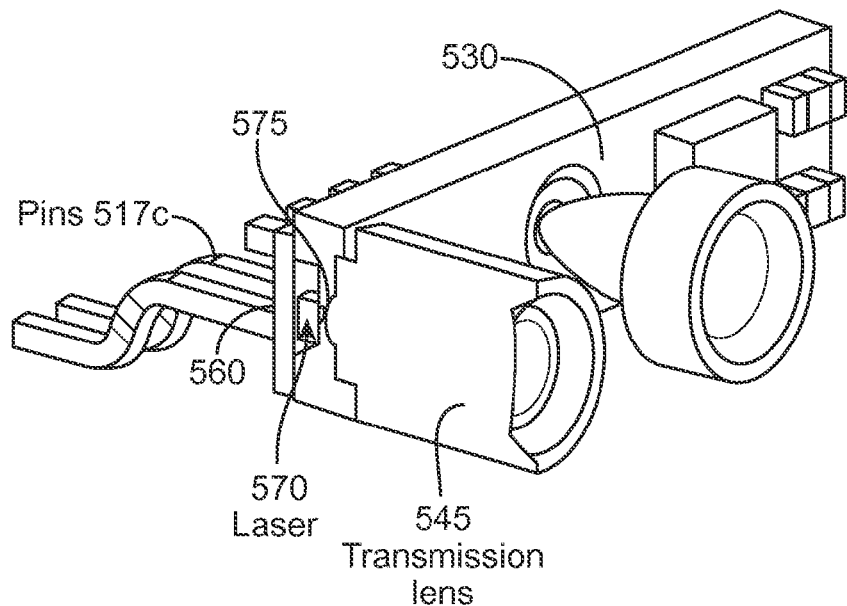
FIG. 5A shows a cross-sectional side view of substrate at the connection point of an optical transmitter according to embodiments of the present invention.

FIG. 5A shows a cross-sectional side view of substrate 530 at the connection point of an optical transmitter 570 according to embodiments of the present invention. In one embodiment, substrate 530 can correspond to substrate 430 of FIG. 4. Substrate 530 can be machined to have certain shapes for the attachment of devices to it.

In one embodiment, a laser 570 or other optical transmitter is mounted to the back of substrate 530. A pocket has been cut into the back of substrate 530. Laser 570 is placed inside the pocket, which allows ground plate 560 (which can correspond to ground plate 460) to cover laser 570. Ground can be received at ground plate 560 from pins 517c. In one aspect, ground plate 560 can cover laser 570 while remaining flat, thereby providing easy manufacturing. In one embodiment, substrate 530 is ceramic, which can be machined to higher tolerances than plastic (e.g. FR4).

A hole 575 formed through substrate 530 can allow light from laser 570 to shine through to transmission lens 545. For example, laser 570 can shine light through hole 575 to transmission lens 545 when electrical signals are received from other electronics on substrate 530. In one embodiment, laser 570 is a vertical cavity surface emitting laser (VACSEL).

Transmission lens 545 can include a barrel shaped tube with a lens (e.g. a curved lens), which can provide light out in a generally parallel direction. The front of substrate 530 can be machined to receive the back end of transmission lens 545. For example, the very back end of lens 545 can be made to fit into hole 575. In one embodiment, an air gap can exist between laser 570 and transmission lens 454. In another embodiment, the back of transmission lens 545 can be in contact with laser 570.

Figure 5B:
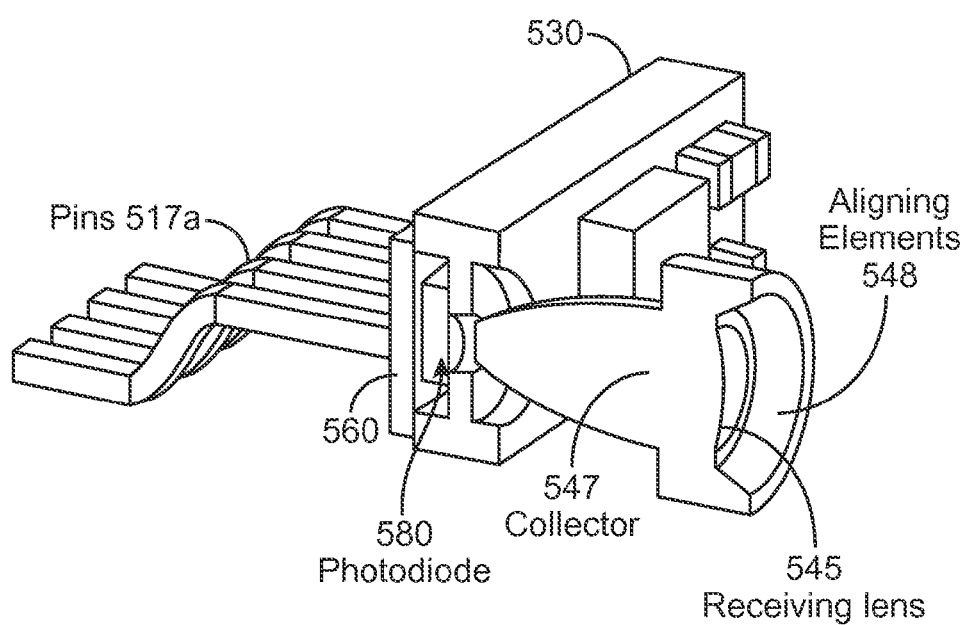
FIG. 5B shows a cross-sectional side view of substrate at the connection point of an optical receiver according to embodiments of the present invention.

FIG. 5B shows a cross-sectional side view of substrate 530 at the connection point of an optical receiver 580 according to embodiments of the present invention. A receiving lens 545 can receive optical signals from an optical device of a corresponding connector.

As shown receiving lens 545 is attached to or part of collector 547 (e.g. a parabolic concentrator), which collects light and provides the light to a photodiode 580 or other optical receiver. Substrate 530 can be machine to have pockets on the front and the back in a similar manner as the pockets for laser 570 and transmission lens 545. The photodiode 580 creates electrical signals from the optical signals. The electrical signals can be modified with other electronics and provided to a circuit board via pins 517a.

Collector 547 has a large opening at receiving lens 545 and a small opening at substrate 530. Collector 547 can be molded, e.g., from plastic. Light is delivered to an active area of photodiode 580 through the small opening, which can allow photodiode 580 to be small, thus reducing its capacitance. Thus, light is collected at a larger diameter and delivered at a smaller diameter. This collection of light can allow more light to be provided to photodiode 580 than if receiving lens 545 was the same size as photodiode 580.

In one aspect, since receiving lens 545 is relatively large, the alignment between receiving lens 545 and an optical device (e.g. a fiber, lens, or fiber/lens combination) of the corresponding connector is not as crucial. For example, when light leaves the optical device of the corresponding connector, the light diffuses out and might miss the lens. As collector 547 can be made wide (e.g. wider than the optical device), misalignment can still not cause a significant amount of light to be lost. In this manner, some misalignment can be accommodated while still providing a functioning connector.

The capacitance of photodiode 580 can increase as the active area of photodiode 580 gets bigger. A photodiode with an active area the same size as receiving lens 545 would have a large capacitance. A high capacitance causes problems at high data rates. Thus, for high data rates, such a large photodiode would be problematic. In one embodiment, photodiode 580 has a capacitance of 0.6 pf or less.

Accordingly, collector 547 can allow the use of a smaller photodiode, so that higher data rates can be achieved, while still allowing relatively large alignment tolerances. In one embodiment, the alignment tolerance can be 150 microns. For example, a 150 micron change in alignments off-axis will not result in diminished operation for the transmission of the optical signals.

Along with providing larger tolerances for alignment, collector 547 can accommodate cables with larger fibers. For example, a fiber in the connecting cable can have a relatively large diameter (e.g., about 200 to 500 microns), as opposed to smaller standards (e.g. 50-80 microns). This larger diameter can be less susceptible to scratches and debris (such as dust, hair, or lint). Collector 547 can be designed specifically for a particular sized fiber. The shape of collector 547 can be dependent on the size (e.g. width and shape) of the large opening, the size of the small opening (which may correspond to the size of photodiode 580), and the wavelength of the light being used.

To provide fine alignment of the optical interface, receiving lens 545 and/or transmission lens 545 can include an aligning element 548. Aligning element 548 can be angled so that front edges of the fiber (or lens over the fiber) of the corresponding connector are moved toward the center of receiving lens 545. Other alignment features, such as the shape of the plug (see FIG. 2), can help to provide initial alignment to get the front of the fiber (e.g. passive optical component 264) close to receiving lens 545. Thus, aligning element 548 can provide lateral alignment of the optical interface.

To ensure that the corresponding fiber or other optical element makes contact with aligning elements 548, the corresponding connector (e.g. male plug connector 260) can have a spring (e.g. a coil spring) that pushes the optical element forward to make contact with aligning element 548. The lens device may have angled aligning elements that engage aligning element 548. A combination of the spring and the aligning element 658 can control the gap between the fiber and receiving lens 545 to be within a tolerance.

In one embodiment, receiving lens 545 can have a rounded shape to provide some focusing of the light from the fiber toward the lens so that the light does not escape. In another embodiment, receiving lens 545 and collector 547 may be a single piece (e.g. an integral piece of glass). In yet another embodiment, receiving lens 545 may be a separate piece from collector 547. For example, receiving lens 545 could be made of sapphire, glass, clear ceramics, or harder material to prevent scratching, where as collector 547 could be made of plastic. In another aspect, a coating could be applied to receiving lens 545. Receiving lens 545 can be close to the end of the connector to allow for easy replacement.

FIG. 6A is a perspective view of a female connector 600 capable of communicating electrical and optical signals according to embodiments of the present invention. FIG. 6B is a front view of the female connector 600 capable of communicating electrical and optical signals according to embodiments of the present invention. Female connector 600 may be a finished connector that can be put into an electronic device, docking station, or other device.

In one embodiment, female connector 600 has an insulator core 610. Insulator core 610 may be created by applying an overmold to a lead frame assembly (e.g. as shown in FIG. 3 without carrier 310). For example, a plastic housing could be molded over pins 617, a substrate with active optical components, and pins that connect with the substrate. Insulator core 610 can cover the electronics (e.g. electrical components 455 and 458) on the front of the substrate, and cover part of lenses 640 while still leaving the front of lenses 640 exposed.

Pins 617 and pins that service the active optical components of the substrate may be exposed in the back female connector 600, prior to incorporation into a device. A shell 650 can be placed around insulator core 610, or at least a front part of insulator core 610. Shell 650 can be made of metal in order to shield pins 617 from electromagnetic interference. In one embodiment, a front edge of female connector 600 can be the front edge of insulator core 610, which may coincide with a front edge of shell 650.

In one embodiment, lenses 640 could be added in after insulator core 610 is over molded. For example, insulator core 640 could be drilled to form holes where lenses 640 are to be placed. In one aspect, the substrate would already have the holes in the proper place, and thus just the overmold may need to be drilled. In another embodiment, insulator core 610 could be formed with a space for the lenses to be fit. As lenses 640 can have their front surface at a front of the connector, lenses 640 can be cleaned easily to ensure continued operation.

Female connector 600 can have alignment features of an opening 605 for an insert portion of a male plug connector (e.g. insert portion 274). Fine alignment of the optical interface can be provided by aligning elements of lenses 640 (e.g. aligning element 548). Thus, alignment features of female connector 600 can be sufficient to provide proper alignment of the optical interface. In some embodiments, the height and width of shell 650 is consistent with connectors that are purely electrical.

III. Manufacturing of Female Hybrid Connector

Figure 7:
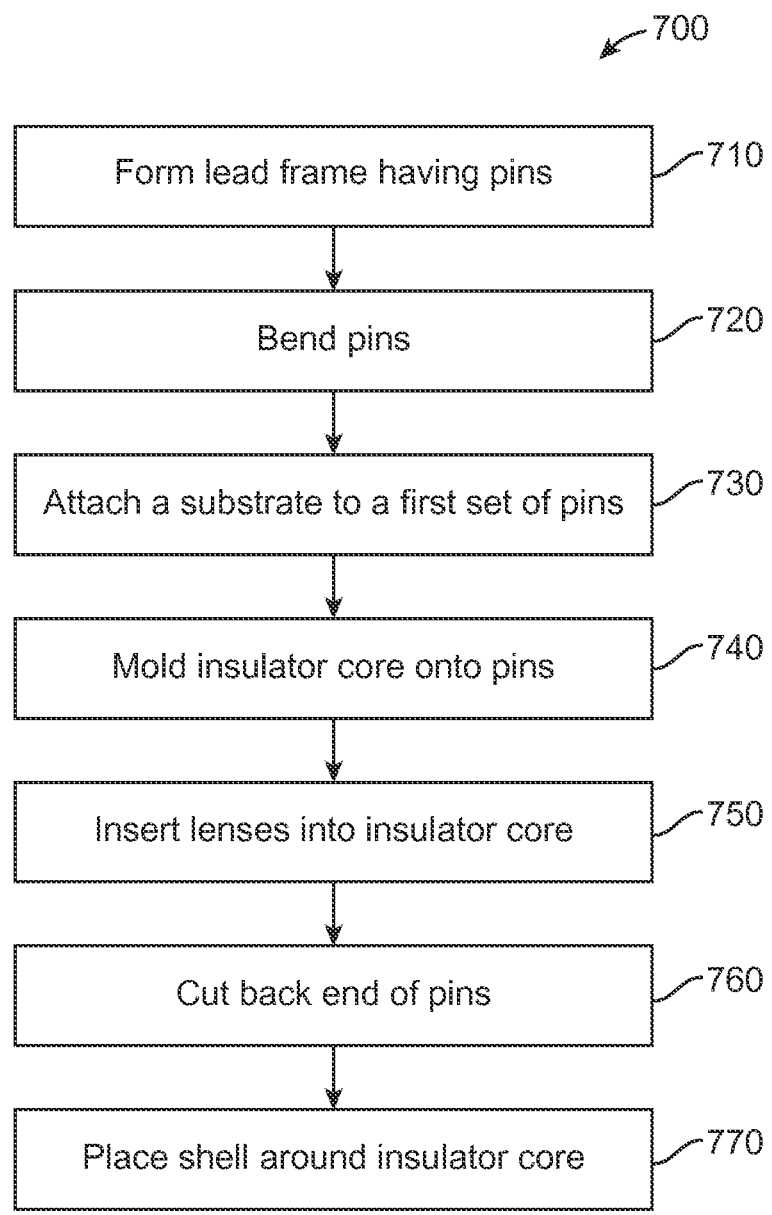
FIG. 7 is a flowchart of a method for making a female connector according to embodiments of the present invention.

FIG. 7 is a flowchart of a method 700 for making a female connector according to embodiments of the present invention. Method 700 can be used to create various intermediate assemblies and connectors as shown in FIGS. 3-6.

In block 710, a lead frame having pins is formed. Lead frame can be made from a single piece of conductive material. For example, a strip of conductive material can be stamped into a shape that has a carrier piece (e.g. carrier 310) and a plurality of pins (e.g. pins 315 and 317). The plurality of pins can include a first electrical set (e.g., 315) and a second optical set (e.g. 317) of pins. The different sets may be designated for different types of electrical signals (e.g. one set may be for electrical signals that are communicated via an optical interface). The pins may be of varying length and shape.

The plurality of pins can extend from the carrier piece in the same plane as the carrier piece. In one aspect, there may be gaps between certain pins. For example, the gaps may be the same as the gaps between pins 417*a* or 417*b* and pins 417*c*. In one embodiment, one or more of the optical pins may have a plate at the end of them, e.g. ground plate 460. The ground plate can be created at the same time that pins 417 are stamped.

In block 720, the pins are bent. In one aspect, the pins are bent to allow connection to a circuit board once they are cut from the carrier piece, and to allow additional steps to be performed. The different sets of pins can be bent into different shapes. For example, the electric pins can be longer and be bent down at the front tips, whereas the optical pins can be bent up for later attachment to a substrate (e.g. substrate 430). Also, the different pins within a set can bent differently. For example, pins for carrying ground can be bent differently than the pins for carrying data signals.

In block 730, a substrate (e.g. substrate 430) is attached to the optical set of pins. The substrate can have at least one active optical component for receiving and/or transmitting optical signals to a corresponding connector. At least a portion of the optical set of pins are communicably coupled with the at least one active optical component and are configured to carry electrical signals corresponding to the optical signals.

In one embodiment, the substrate has been previously machined to have pockets on the front and back for accommodating active optical components and for accommodating a transmission lens and a receiving lens apparatus, which can include a light collector. Holes may be formed between corresponding pairs of pockets on the front and back end for light to pass through.

In block 740, an insulator core (e.g. insulator core 610) is molded onto the pins. In one aspect, the insulator core can be molded over only a portion of each pin (e.g. a front portion). The insulator core can also be molded over the substrate. In one embodiment, the insulator core covers the electrical pins up to and potentially past their front tips. The electrical set of pins can extend past the optical set of pins toward a front of the connector for mating with electrical contacts of the corresponding connector.

In block 750, lenses may be inserted into the insulator core. In one embodiment, the insulator core can be drilled to form holes for the lenses. The holes may be drilled where pockets have already been formed into the substrate. In another embodiment, the insulator core can be molded with the holes already in place. In yet another embodiment, the lenses may be attached to the substrate before the insulator core is molded.

In block 760, a back end of the pins are cut. The back end of the pins can then later be electrically connected (e.g. soldered) to a circuit board.

In block 770, a shell is placed around the insulator core. The shell (e.g. shell 650) can be placed around all of the insulator core or only part of it (e.g. a front portion). The shell may provide shielding from electromagnetic interference, and it also may act as alignment feature for a male plug that is inserted into an opening in the female connector.

IV. Adapter Using Collector

Figure 8:
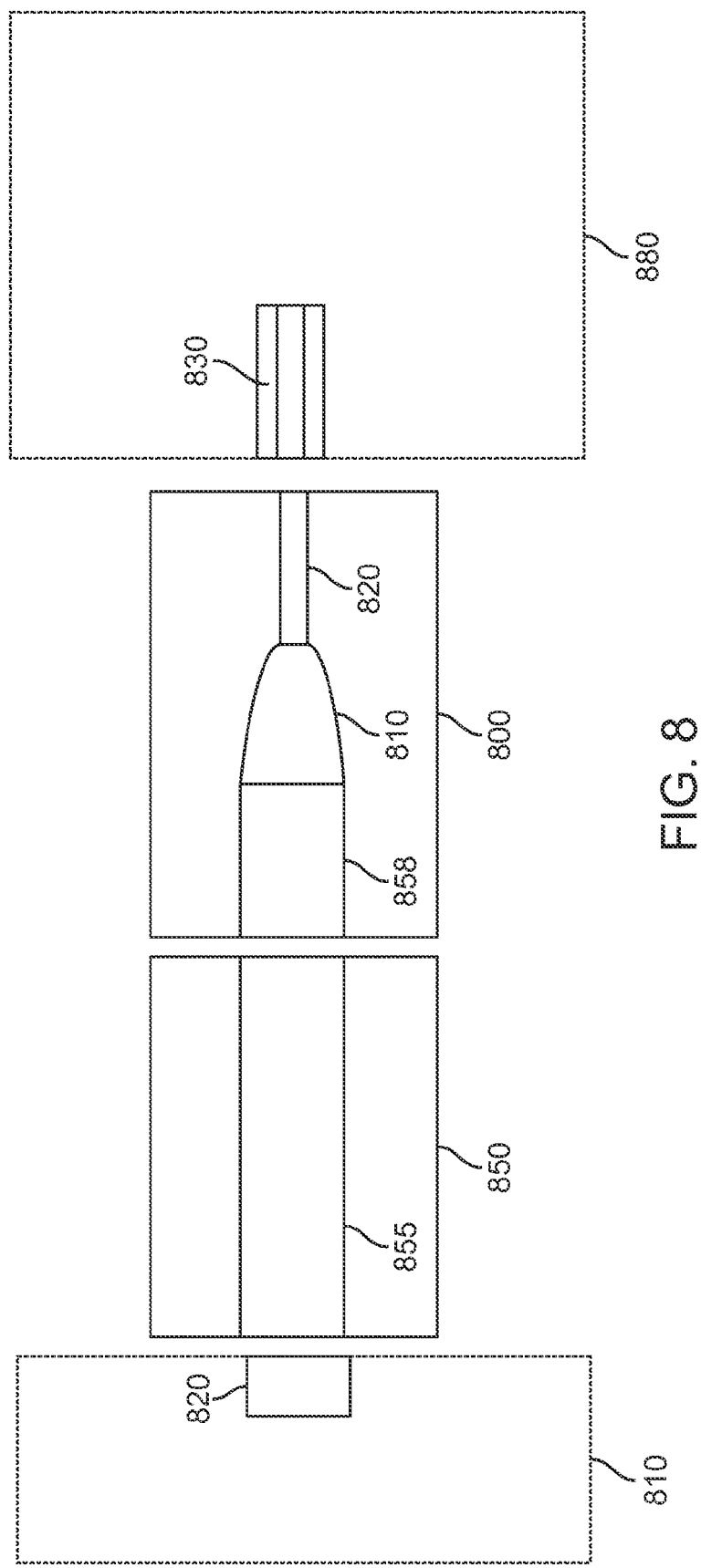
FIG. 8 shows an adapter for converting optical data signals from a large width fiber to a smaller width fiber according to an embodiment of the present invention.

FIG. 8 shows an adapter 800 for converting optical data signals from a large width fiber to a smaller width fiber according to an embodiment of the present invention. As mentioned above, connectors consistent with embodiments of the present invention can receive optical signals from optical cables that have relatively large optical fibers. However, it may be desirable to provide a connection to an interface that uses a fiber with a relatively small width. In one aspect, collector 810 (e.g. collector 547) can provide such conversion in adapter 800. As used herein, an optical data signal carries bits of data in pulses of light.

Optical cable 850 can have a first connector (not explicitly shown) that connects with an electronic device 810 having an optical or electro-optical connector 820, e.g. a connector interface described in FIGS. 1-6. For example, the first connector can be the male plug connector 260 of FIG. 2. Optical cable 850 can carry optical signals using an optical fiber 855 (which may include a multi-core fiber) that has a relatively large diameter. In one embodiment, optical cable 850 can correspond to cable 150 of FIG. 1.

In one embodiment, if the electronic device (e.g. device 110) needs to connect to another electronic device 880 that has an interface that uses a smaller fiber, adapter 850 can provide the conversion of the optical signals from a large diameter fiber to a small diameter fiber. Adapter 800 can have one end that receives optical data signals with a first fiber 858 having the large width. Collector 810 (e.g. a parabolic concentrator) can collect the light at the large width and provide the light to a small width fiber 820. In another embodiment, collector 810 may receive the light directly from fiber 855, and thus adapter 800 would not have fiber 858.

Adapter 800 can then provide optical signals using small fiber 820 to a connector 830 of a receiving device 880. As connector 830 requires a smaller fiber at its interface, adapter 800 is used. Typically, connector 830 will have a smaller tolerance for alignment than other connectors mentioned herein.

In another embodiment, cable 850 can include adapter 800 that reduces the width of the connector down to the smaller fiber. In this embodiment, cable 850 would include collector 810 coupled with fiber 855, thereby making cable 850 into an adapter. Cable 850 can also include smaller-width fiber 820, which can then be connected with connector 830. If such an optical cable 850 is only to convey optical signals to connectors of the type of connector 830 (or other optical only connectors), then optical cable 850 may not have electrical contacts or electrical wires.

In yet another embodiment, adapter 800 (or cable 850 constructed as an adapter) can have two collectors in opposite directions. Once collector could be used for transmission to another electronic device 880 and the other collector could be used for transmission from another electronic device 880.

V. Docking Station with Optical Element

Figure 9A:
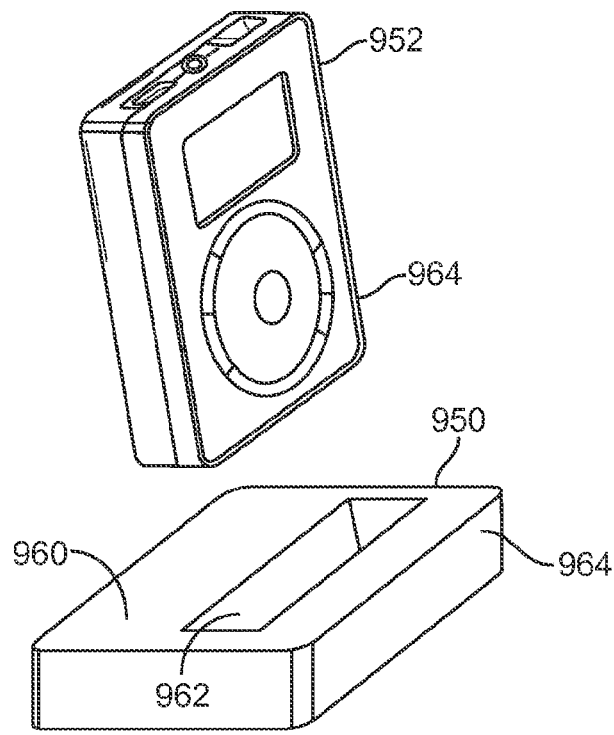
FIG. 9A illustrates a system with a docking station having at least one active optical component and an electronic device having at least one active optical component according to embodiments of the present invention.
Figure 9B:
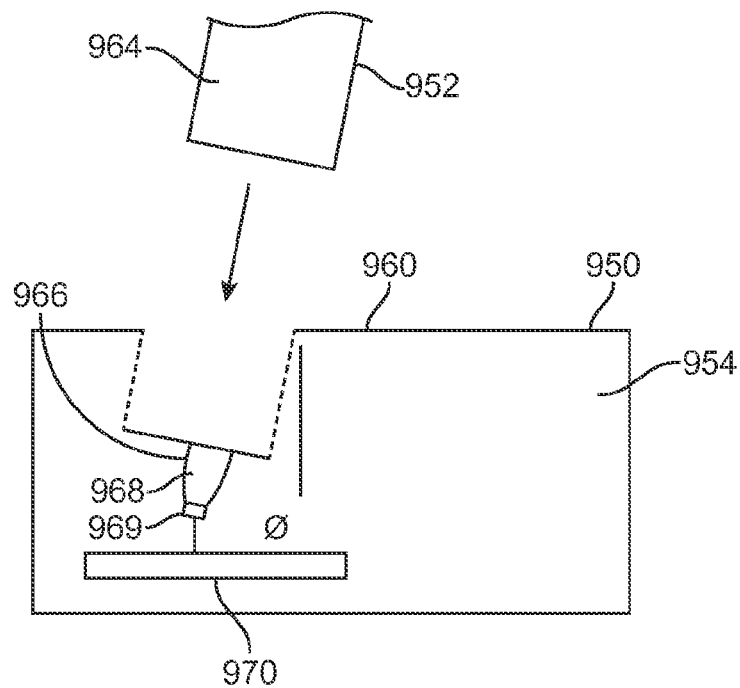
FIG. 9B is a cross-sectional side view of electronic device and docking station according to embodiments of the present invention.

FIG. 9A illustrates a system with a docking station 960 having at least one active optical component and an electronic device 952 having at least one active optical component according to embodiments of the present invention. FIG. 9B is a cross-sectional side view of electronic device 952 and docking station 960 according to embodiments of the present invention. In one embodiment, electronic device 952 and docking station 960 have connectors that include a collector, which allows a high tolerance for misalignment. Thus, only a coarse alignment features are used, which can provide optical communication with no structural connection. In one aspect, such a connection does not use electrical contacts.

Docking station 950 can allow an electronic device 952 or other electronic device to communicate with other media devices (not shown). As shown, docking station 950 includes a housing 954 that encloses internally various electrical and structural components and that defines the shape or form of docking station 950. The shape of housing 954 may be widely varied. For example, it may be rectangular, circular, triangular, cubical, and the like. In the illustrated embodiment, housing 954 has a rectangular shape. Housing 954 may be formed by one or more housing components. For example, as shown, housing 954 may be made up of a top member 956 and a base member 958. The manner in which members 956 and 958 are connected may be widely varied (e.g., screws, bolts, snaps, latch, etc.).

Within a top surface 960 of housing 954, there is provided a media bay opening 962 for physically receiving a bottom portion 964 of the electronic device 952. As shown, the media bay opening 962 has shape that coincides with the shape of electronic device 952, i.e., bottom portion 964 of electronic device 952 may be inserted within media bay opening 962. The depth of opening 962 can generally configured to keep the user interface of the electronic device 952 exposed to the user. Opening 962 may be vertical or sloped. As shown in FIG. 9B, opening 962 is sloped so that electronic device 952 rests in a tilted position within the docking station 950. As should be appreciated, a tilted electronic device 952 is easier to use (e.g., more ergonomic). The slope may be widely varied. For example, it may tilt electronic device 952 about 5 to about 25 degrees and more particularly about 15 degrees.

Beneath a bottom surface of opening 962, there is provided a first optical connector 966 for engaging a corresponding optical connector disposed on the bottom surface of electronic device 952. By way of example, first optical connector 966 may include lenses and a collector 968 as described in FIGS. 4, 5A, and 5B. However, in one embodiment, there are no electrical contacts.

One or more active optical component s 969 can optically coupled with a small opening of the collector, e.g., a photodiode can receive light at the small opening of collector 968. The electrical signals from the photodiode can be modified or sent directly to a circuit board 970. As should be appreciated, the sides of the opening 962 can serve as alignment elements for placing the connectors in the correct position. As the alignment is not too sensitive, other general alignment features besides the sides of the bay opening can also serve as the alignment features.

The corresponding optical connector of electronic device 952 can have a transmitting lens that has a similar dimension as the large opening of collector 968 of first optical connector 966. Thus, as both connectors have similar and relatively large dimension, the alignment between the connectors is not as critical. The connectors do not have to be perfectly aligned in order to still communicate optical signals. Thus, a structural connection, as provided with an insert portion described for FIG. 2 is not needed. Note that as the active optical components in both connectors can be kept small, high data rates can be achieved.

Accordingly, the bottom surface of opening 962 can be flat. Also, the bottom surface of opening 962 can be made of material that is opaque to visible light, but which transmits light in the wavelength (which is not in the visible spectrum) that is used to communicate the optical signals between electronic device 952 and docking station 950. Thus, docking station 950 can communicate data without a need for a physical connection to electronic device 952. In fact, docking station 950 may appear as if there is no connector at all.

In one embodiment, docking station 960 can also include inductive charging mechanism. For example, a vertical wall can extend from surface 960 to engage a back of electronic device 952. The vertical wall can have inductive coils that can charge electronic device 952, which also has inductive coils.

V. Male Plug with Spring for Optical Elements

As mentioned above, embodiments of connectors with optical elements can have a spring that pushes an optical element toward an optical element of the corresponding connector. This movement can provide alignment of the corresponding optical elements and can provide a smaller distance between the optical elements, which can reduce signal loss and interference. One or more of the mating optical elements (e.g. lens or fiber) of the male plug connector and/or the female receptacle connector can have a spring mechanism, as opposed to having a fixed fiber and ferrule as may occur in other embodiments.

Figure 10:
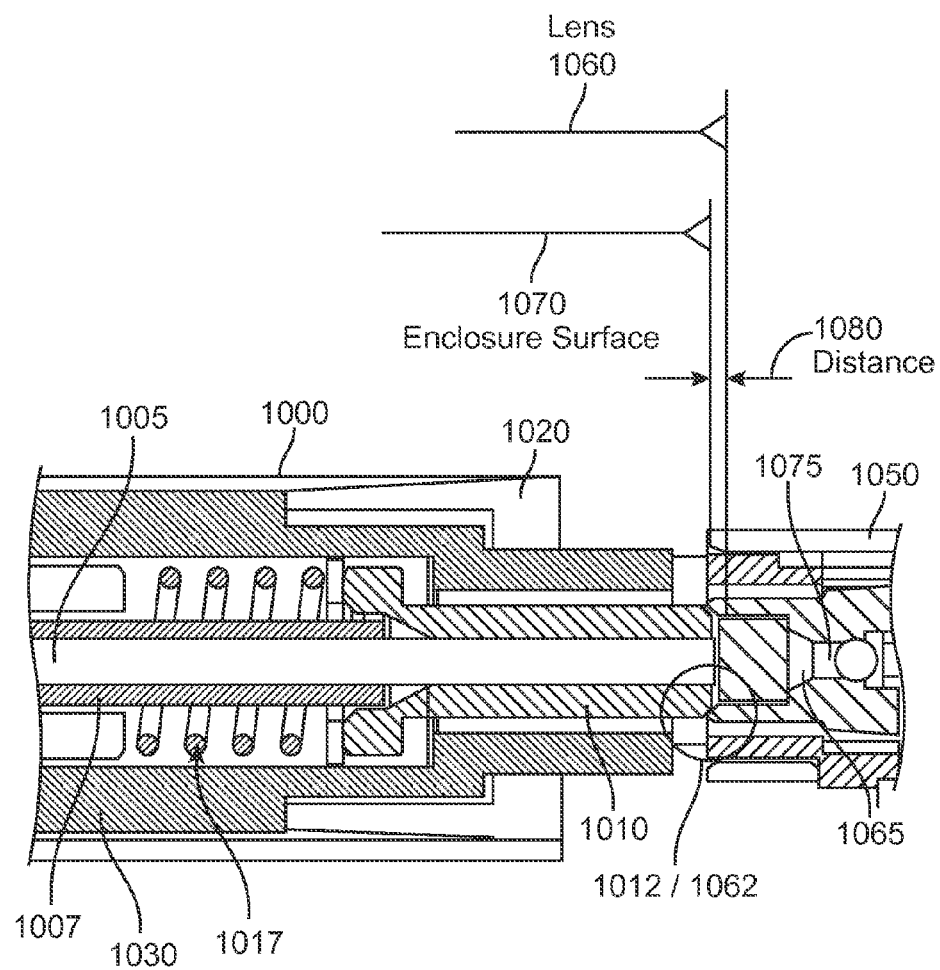
FIG. 10 is a cross-sectional view of a male connector having a spring mechanism for an optical element mated with a corresponding female receptacle connector according to embodiments of the present invention.

FIG. 10 is a cross-sectional view of a male connector 1000 having a spring mechanism for an optical element mated with a corresponding female receptacle 1050 connector according to embodiments of the present invention. Male plug connector 1000 can include an enclosure 1020, a connector housing 1030, and a fiber 1005 with a sleeve 1007, which may provide protection and may be reflective. Near the interface with female connector 1050, fiber 1005 can have a ferrule 1010 surrounding it. In one embodiment, ferrule 1010 is made of metallic material.

In various embodiments, ferrule 1010 can provide strength to fiber 1005 and can provide alignment. In one embodiment, ferrule 1010 has an aligning element 1012 (e.g. a chamfer) that helps to provide alignment. In another embodiment, a spring 1017 pushes ferrule 1010, along with fiber 1005, forward toward the female connector 1050. The forward force can cause ferrule 1010 to engage aligning elements 1062 (e.g. aligning elements 548 from FIG. 5) of female connector 1050. The aligning elements 1062 (e.g. a chamfer) can cause fiber 1005 to move up or down to being fiber 1005 more in alignment with lens 1060 (or other optical element).

The ferrule and fiber combination of male connector 1000 can have a freedom of movement at least in an up and down direction (as shown). For example a space can exist between ferrule 1010 and housing 1030. This freedom of movement along with a force from the engagement of the aligning elements can provide the relative movement of fiber 1005 and lens 1060 to bring them into alignment.

As one can see, fiber 1010 can be aligned with a center of lens 1060. Fiber 1010 can also be aligned with collector 1065 and active optical component 1075. With better alignment, more light from fiber 1005 can reach the active optical component 1075, thereby providing a stronger signal. In one embodiment, the aligning elements 1012/1062 can ensures fiber X/Y alignment to ±0.07 mm, where X/Y is vertical and in/out of the paper, as shown.

In some embodiments, a surface of lens 1060 is only slightly below an enclosure surface 1070. Having distance 1080 between these two surface be small (e.g. 15 mm) can help to prevent debris from being trapped and can allow for cleaning of lens 1060. Distance 1080 being small can also help provide a small gap between the optical elements of the two connectors.

In other embodiments, aligning elements 1012/1062 can maintain a gap between lens (e.g. a transmission or a receiving lens) and fiber 1005 to prevent or reduce abrasion. The width of the distance between the upper and lower aligning elements 1062 can be smaller than a width of ferrule 1010 to provide gap 1080. Spring 1017 can keep ferrule 1010 seated against aligning elements 1062, which can keep end gap to a maximum of 0.15 mm. In one embodiment to reduce abrasions, lens 1060 may be made of a hard material, such as hardened glass (e.g. aluminosilicate glass), sapphire, clear ceramics, spinel (e.g., Magnesium Aluminum Oxide), and aluminum oxynitride (e.g. ALON™), which can be transparent in the wavelength of the transmitted light. With a durable lens, it may be acceptable, and even desirable, to have the two optical elements to actually touch, thereby providing better transmission of light from one connector to another. The lens can cause a reduction in total light transmitted under perfect conditions, but the lens can provide durability (e.g. less scratches) so that the total light that can be transmitted does not severely diminish over time, e.g. due to scratches.

VI. Proud Lens on Female Connector

In some embodiments, it may be desirable to have optical elements of the female connector protrude to engage optical elements of the female connector. Such a protruding construction can provide for cheaper manufacturing, and allow the optical elements on the male connector to be flush or recessed with an enclosure surface. Having a front edge of an optical element of the male plug connector being flush or recessed can provide for a more durable male plug connector. As the make plug connector may be used for many devices, often shove in a drawer or other space with other objects, and other such hard use, it may be desirable for the optical element of the male plug connector to not protrude as in FIG. 10. Such a protruding construction for the female connector can also provide contact between two surfaces of optical elements of the connectors, which can provide better transmission of light.

Figure 11A:
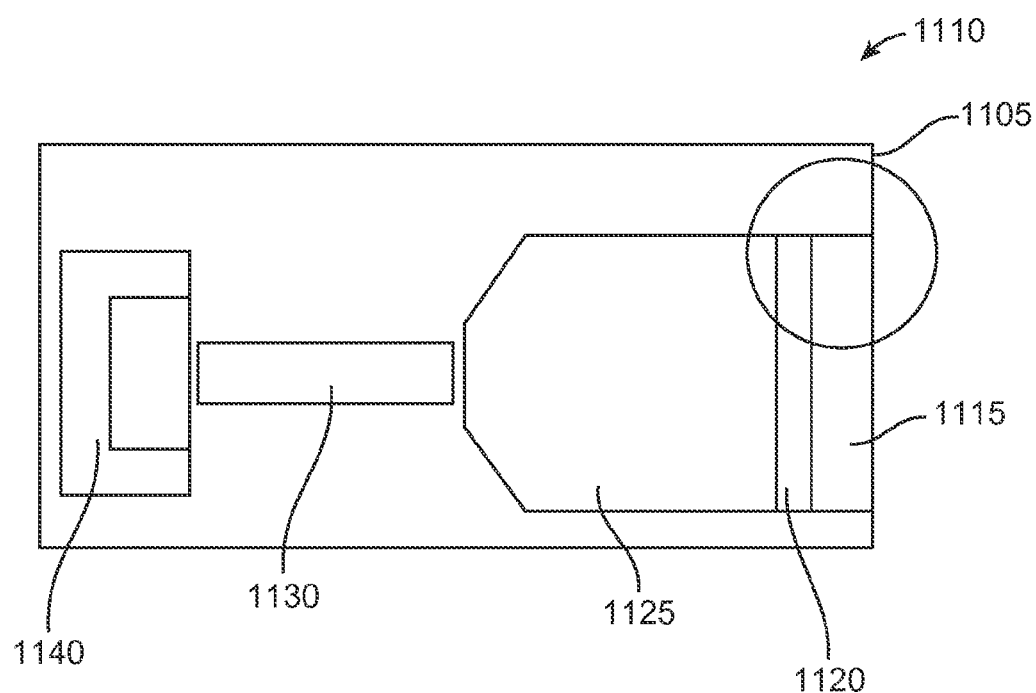
FIG. 11A is a cross-sectional view of an optical element having a proud surface relative to an external surface of the connector according to embodiments of the present invention.

FIG. 11A is a cross-sectional view of an optical element having a proud surface relative to an external (outer) surface of the connector according to embodiments of the present invention. Connector 1110 is shown having an external surface 1105. In the embodiment shown, connector 1110 includes a lens 1115, optically clear adhesive 1120, collector 1125, optical fiber 1130, and an active optical component 1140. In various other embodiments, optical fiber may be omitted such that collector 1125 transmits light directly to active optical component 1140; collector 1125 and lens 1115 may be an integral piece (thus obviating a need for an adhesive); and lens 1115 may be made of a hard material such as sapphire.

In one embodiment, the optical clear adhesive can be a liquid. In one embodiment, the adhesive is a pressure sensitive adhesive. In another embodiment, the front surface of collector 1125 can be non-flat (e.g. concave) and the liquid adhesive can flow to fill in the uneven surface of the connector. The corresponding male plug connector can also have a sapphire lens, which can be attached to the fiber with an optically clear adhesive. In another embodiment, air gaps do not occur between the collector 1125 and lens 1115.

Figure 11B:
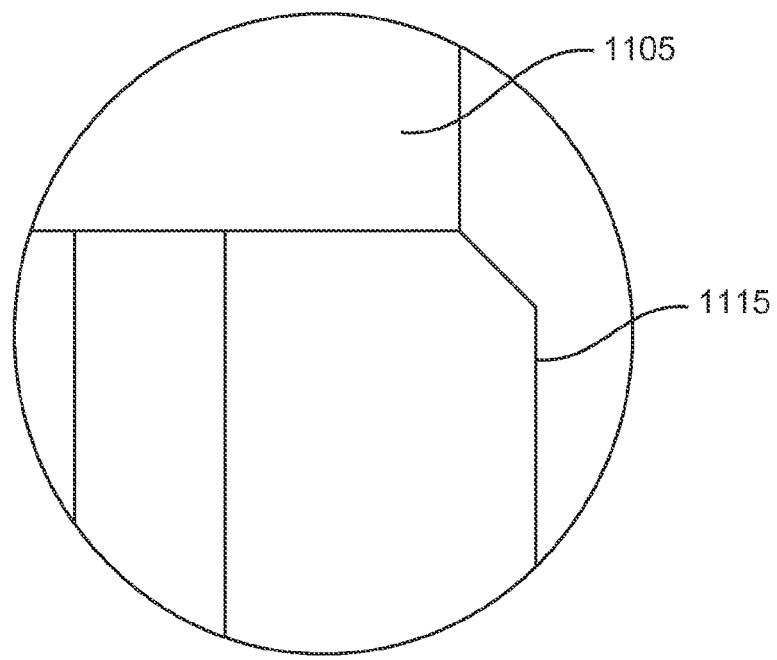
FIG. 11B is a magnified view of the surface of the optical element and the external surface according to embodiments of the present invention.

FIG. 11B is a magnified view of the surface of the optical element and the external surface according to embodiments of the present invention. Lens 1115 has a surface that protrudes from (is proud of) outer surface 1105. In one embodiment, an edge of a surface of lens 1115 is angled, e.g. to provide an aligning element such as a chamfer. The aligning element can be used in a similar manner as described for FIG. 10, but with the male plug connector having a recess for receiving the proud surface of lens 1115. In one embodiment, connector 1110 can also have a spring mechanism to move lens 1115 closer to the surface of the corresponding optical element of the male connector.

In one embodiment, lens 1115 and a corresponding optical element (e.g. another lens) of the male plug connector both protrude from respective outer surfaces. In another embodiment, both or just one of the surfaces are flush, as opposed to protruding. The protrusion from a surface can provide easier access to the lens in order to remove dirt. In yet another embodiment, lens 1115 (and other lenses mentioned herein) can be rounded, which can cause debris on the lens may naturally fall to the edges. The lens and collector could be a single integral part, which could be made of sapphire or other suitably hard and optically clear material. As an example, lens 1115 can be about 1.5 mm to 2 mm in diameter, with a thickness of about 0.5 mm.

VII. Male Hybrid Connector with Small Insert

In some embodiments having connectors with an electrical and optical interface, it can be desirable to have the insert for the electrical interface be small while still providing a sufficient number of contacts. Having the insert be small can reduce the size of the female connector, thereby allowing the electronic device to be smaller or to free up space for additional circuitry in the electronic device.

As an example, the male plug connector 260 can be reduced in size. The male plug connector 260 of FIG. 2A has an insert 274 that fits around the tongue in which electrical contacts 22 reside. In one embodiment, insert portion 274 can be made smaller by removing the top surface of the insert so that the contacts are exposed on one side. The sidewalls can still provide alignment features so that the insert portion is not inserted incorrectly. With a top surface removed, electrical contacts 222 can be placed on a bottom surface of opening 205 instead of being on a tongue that sticks into the middle of opening 205. Thus, receptacle connector 220 can be made smaller.

However, even with such changes, it may be desirable to have an even smaller insert. The sidewalls of insert portion 274 can also be removed, thereby having the contacts be on an outmost surface of the insert. Such an embodiment could lead to users plugging in the insert with an incorrect orientation, which could be ameliorated with other alignment devices, such as notches and keys. Even with the contacts an outer surface, the insert may still have a large width to accommodate all of the contacts in a row (horizontal as shown). To provide enough contacts while still limiting size, some embodiments can have inserts with contacts on more than one surface and/or have contacts that are dependent on depth of insertion.

Regarding one embodiment, contacts can be on a top and bottom surface of the insert. For example, four contacts can be on top and four different contacts can be on the bottom. Thus, eight contacts can be obtained with the same amount of width. In one aspect, the corresponding receptacle would also have mating contacts on a top and bottom interior surface of opening 205, thereby possible causing receptacle connector 220 to have greater height. But, the overall size including width and height can be made smaller. In this manner, more contacts can be fit into a smaller space. However, such an embodiment may still not provide the desired number of contacts within the desired space.

Accordingly, one embodiment has different contacts at different depths. For example, an insert could have a first contact near a front (distal) tip of the insert, and a second contact at the same horizontal location but behind the first contact. The corresponding receptacle connector would have corresponding contacts at different depths within the opening. In this manner, many contacts can be fit onto a small insert. The provisional applications referenced above contain various inserts, which may be used with embodiments of the present invention.

Figure 12C:
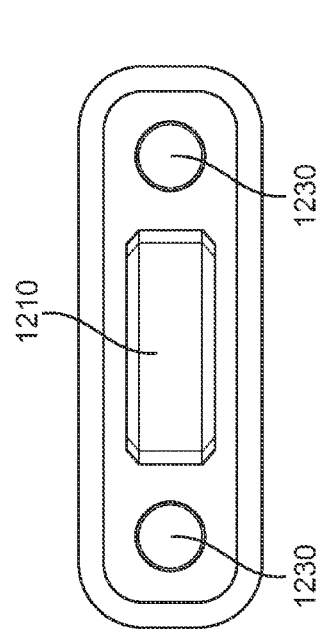
FIG. 12C shows a front view of hybrid male plug connector according to embodiments of the present invention.
Figure 12D:
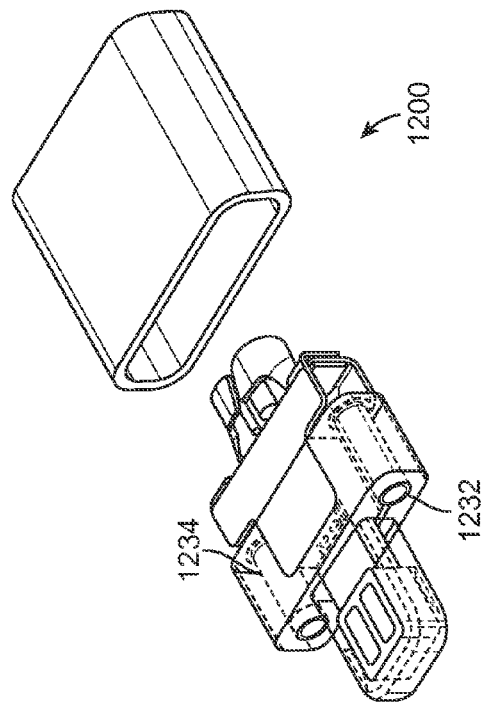
FIG. 12D is an exploded view of hybrid male plug connector according to embodiments of the present invention.
Figure 12A:
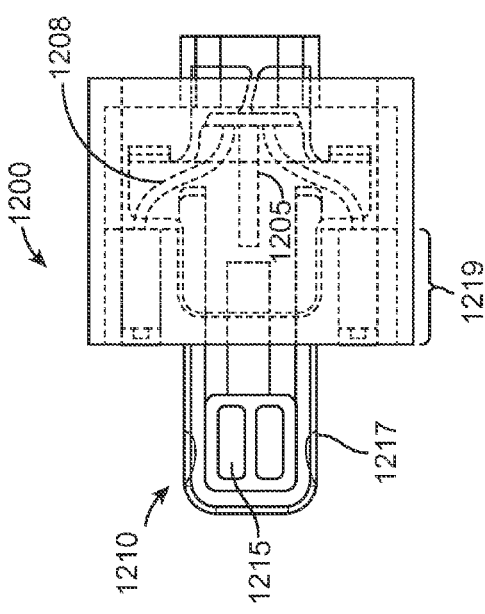
FIG. 12A is a top view of a hybrid male plug connector with a central connector according to embodiments of the present invention.

FIG. 12A is a top view of a hybrid male plug connector 1200 with a central connector according to embodiments of the present invention. Connector 1200 has an insert 1210 with two contacts 1215 on a top surface and one or more contacts 1217 on the sides of insert 1210. Contact 1217 may be a ring that extends from one side over the front of insert 1210 to the other side. In one embodiment, contact 1217 is a ground contact and contacts 1215 can include a power contacts or be contacts for data signals. In one embodiment, insert 1210 is symmetric with regards to the top and bottom. For example, the bottom surface can have two contacts in a same position as contacts 1215. Other embodiments can have more than two contacts (e.g., 4 or 6) on the top surface and/or the bottom surface. Yet other embodiments can have a contact on a front face of insert 1210.

In the embodiment shown, optical links 1219 are shown on either side of insert 1210. In one implementation, one optical link is a transmission link and the other is a receiving link. Interior cable 1215 can be an electrical cable for transmitting electrical signals to/from the electrical contacts of insert 1210. In one embodiment, interior cable 1208 is an optical fiber for communicating optical signals to and/or from an optical link 1219.

Figure 12B:
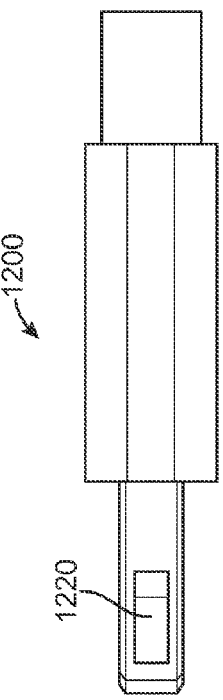
FIG. 12B shows a side view of hybrid male plug connector according to embodiments of the present invention.

FIG. 12B shows a side view of hybrid male plug connector 1200 according to embodiments of the present invention. A recess 1220 (e.g. a notch) is on a side edge. Recess 1220 can be used to secure connector 1200 into the corresponding receptacle connector using a retention mechanism in the corresponding female connector, e.g., with a cantilevers spring or a detent. The top surface with contacts 1215 can be considered a major surface as it is larger than the edge surfaces. Thus, insert 1210 has five contacts in a relatively small space.

FIG. 12C shows a front view of hybrid male plug connector 1200 according to embodiments of the present invention. In one embodiment, optical elements 1230 of optical links 1219 can provide transmission and/or reception of optical signals. Optical elements 1230 can correspond to lenses, active optical elements, collectors, and fibers as described herein.

FIG. 12D is a perspective view of a hybrid male plug connector 1200 according to embodiments of the present invention. In the embodiment shown, optical signals can be passively sent through an optical fiber 1208, which is optically coupled with a lens 1232. Fiber 1208 can be covered with a ferrule 1234. The optical signals can then be sent from lens 1232 to a corresponding optical element of a female connector. In one embodiment, lens 1232 can be a sapphire lens. In another embodiment, ferrule 1234 can be a fixed fiber ferrule, as can be other ferrules mentioned herein.

Figure 13:
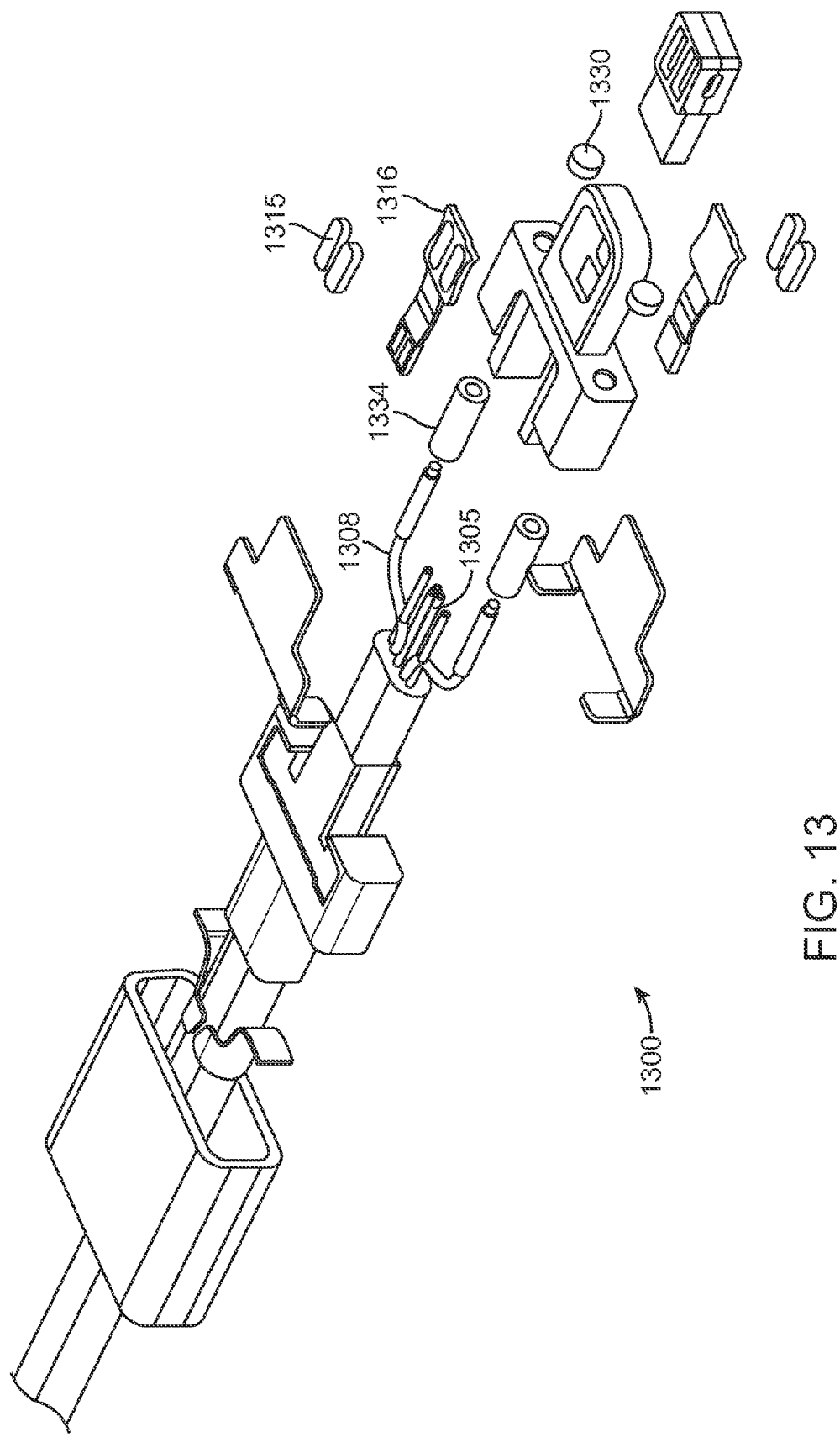
FIG. 13 is a perspective view of a hybrid male plug connector with an active optical component according to embodiments of the present invention.

FIG. 13 shows an exploded view of a passive male plug connector 1300 according to embodiments of the present invention. The male plug 1300 is passive in that internal fiber 1308 transmit optical signal to optical link 1319 for sending to the corresponding female connector. Ferrule 1334 can cover fiber 1308 at the end. Optical elements 1330 can be of various shapes, materials, forms, and functions as described herein. Contacts 1315 can lie on top of a pad 1316. Internal cables 1305 can carry power, ground, and/or data signals for contacts 1315, and other contacts.

Figure 14:
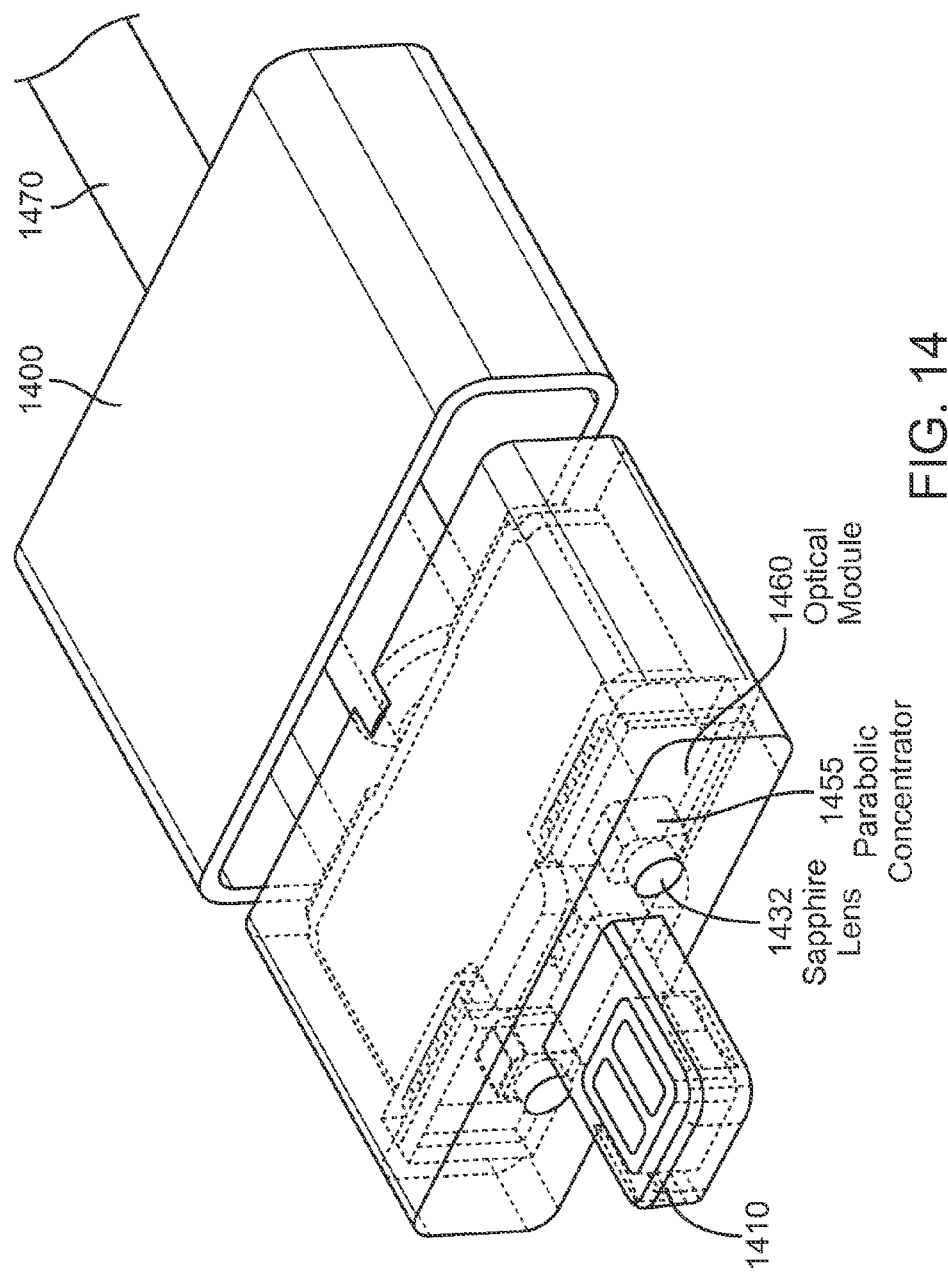
FIG. 14 shows an exploded view of a passive male plug connector according to embodiments of the present invention.

FIG. 14 is a perspective view of a hybrid male plug connector 1400 with an active optical component according to embodiments of the present invention. In one embodiment, plug connector 1400 has a same connector insert 1410 as plug connector 1200. But, the optical aspects of plug connector 1400 can differ from passive plug connector 1200. For example, plug connector 1400 can convert electrical signals to optical signals, and vice versa, such that only electrical signals are carried through cable 1470. For example, a lens 1432 can receive an optical signal, which can be collected by a parabolic concentrator 1455 (or other collector) and sent to an active optical component 1460 for conversion to an electrical signal.

Figure 15:
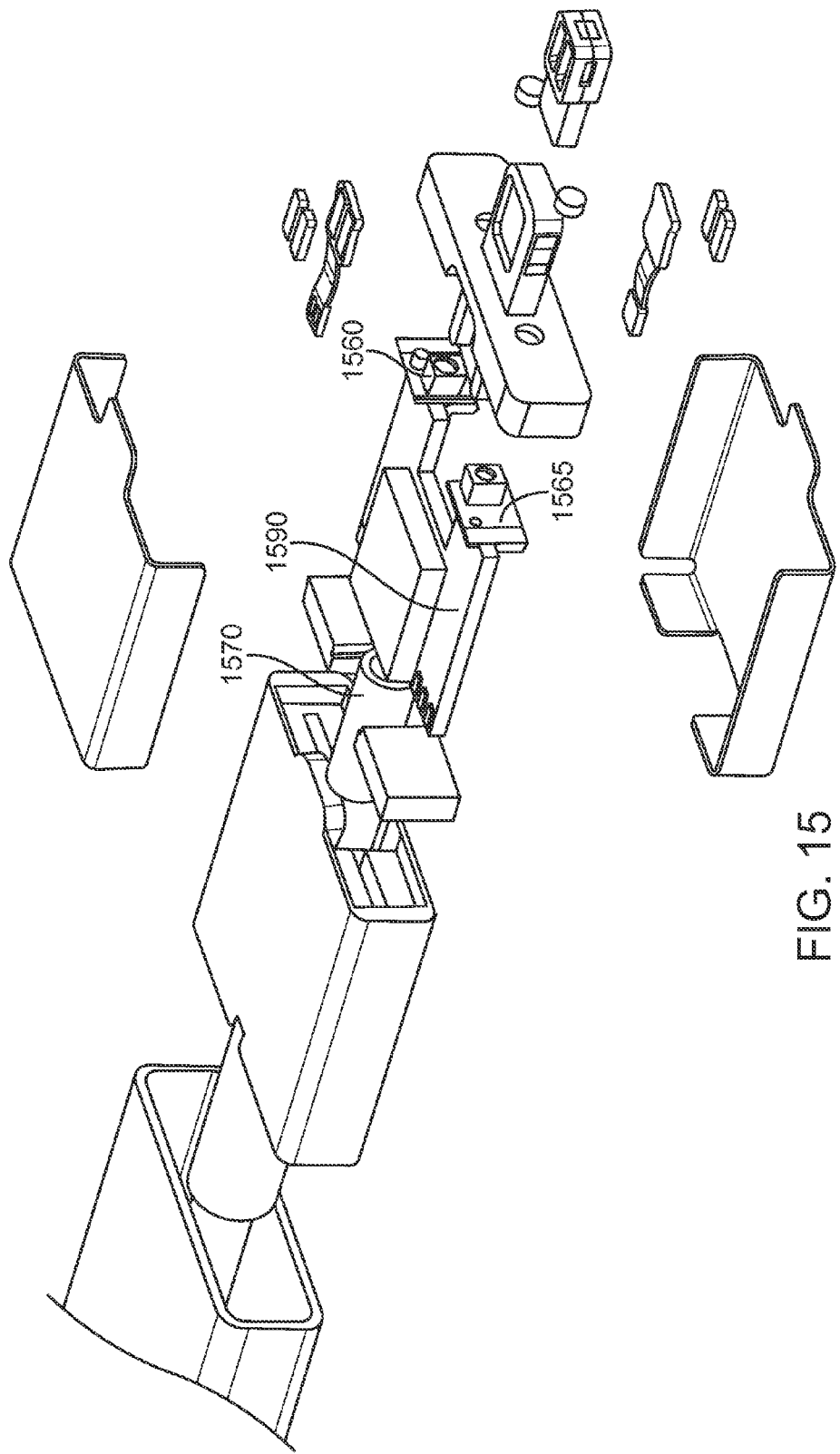
FIG. 15 shows an exploded view of an active male plug connector according to embodiments of the present invention.

FIG. 15 shows an exploded view of an active male plug connector 1500 according to embodiments of the present invention. In the embodiment shown, a circuit board 1590 is coupled with optical modules 1560 and 1565. Electrical signals from wires (not shown) inside a cable 1570 can be attached to circuit board 1590 and transmitted to optical module 1565 for conversion into optical signals. Optical module 1560 can receive optical signals and convert the optical signals to electrical signals transmitted to the wires via circuit board 1590.

VIII. Female Hybrid Connector for Receiving a Small Insert

Figure 16:
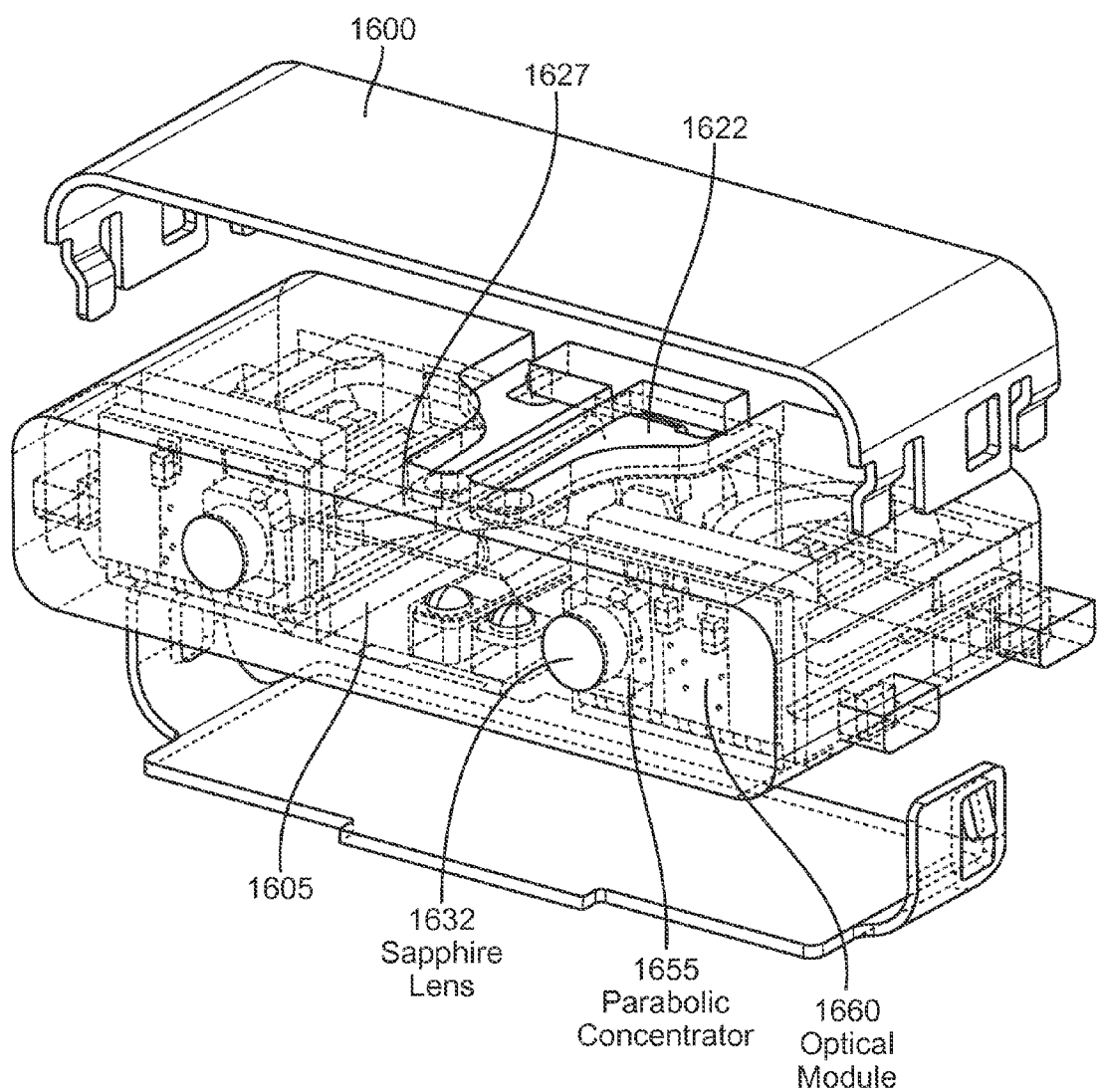
FIGS. 16 and 17A-17C are perspective, front, top, and side views of a female hybrid connector 1500 according to embodiments of the present invention.

FIG. 16 is a perspective view of a female hybrid connector 1600 according to embodiments of the present invention. Female connector 1600 has a lens 1623, collector 1655, and active optical component 1660 as described herein. An opening 1605 can receive an insert, e.g., insert 1210 of male connector 1200. Contacts 1622 on the top and bottom surfaces of opening 1605 can provide an electric connection with contacts 1215 of male connector 1200. Contacts 1627 on the sides of opening 1605 can make an electrical connection with contact 1217 on the edges of insert 1210. In one embodiment, contacts 1627 engage recesses 1220 in contacts 1217, thereby providing a retention mechanism and an electrical connection. The contacts 1627 can be part of a cantilever spring or a detent. In another embodiment, recesses 1220 engage a retention mechanism that is separate from contacts 1627.

Figure 17A:
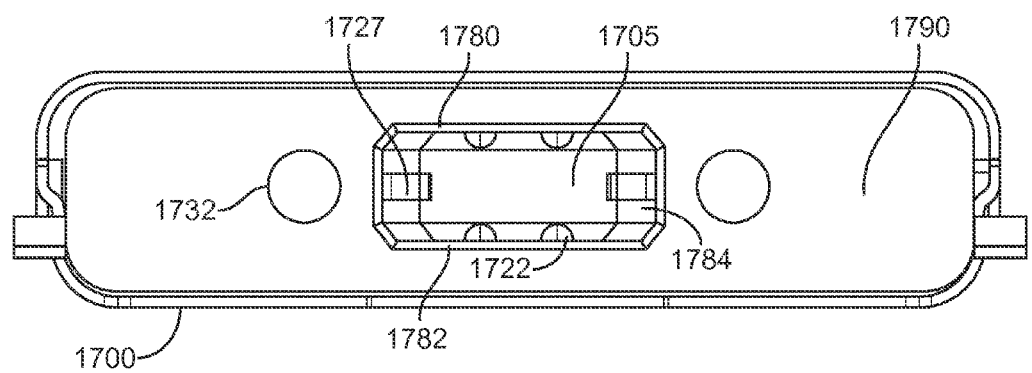

FIG. 17A is a front view of a female hybrid connector 1700 according to embodiments of the present invention. An opening 1705 can receive an insert of a corresponding male connector, e.g. connector 1200 or 1400. Opening 1705 has a top inner surface 1780, a bottom inner surface 1782, and two side inner surfaces 1784. In one embodiment, four contacts 1722 on the top and bottom inner surfaces can receive electrical signal from an insert. In one embodiment, there is one power contact, one identification contact, and two data contacts, which can provide a differential signal. Two contacts 1727 can receive two signals or the same signal from side contacts on an insert. In one embodiment, contacts 1727 both receive ground.

In various embodiments, contacts 1722 can receive power, data, or an identification signal, or any combination thereof. The identification signal can be used to determine the type of device that the male plug connector is part of, and thus which type of data signals are to be sent (e.g. audio, video, etc.). The type of signals to be sent can also be determined based on a program that is being run on a processor of the electronic device to which the female connector is part of. Female connector 1700 also has two lenses 1732 for receiving optical signals from the corresponding male connector.

Figure 17B:
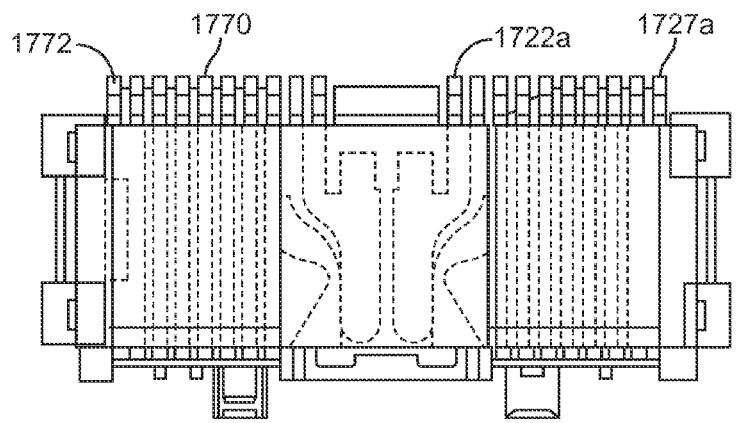

FIG. 17B is a top view of a female hybrid connector 1700 according to embodiments of the present invention. FIG. 17B shows different sets of pins 1722a, 1772a, and 1770. In one embodiment, pins 1722a are a tail end of contacts 1722, and thus contacts 1722 can be considered front ends of pins 1722a. In another embodiment, pins 1727a are a tail end of contacts 1727, and thus contacts 1727 can be considered front ends of pins 1727a. Any of the pins may be electrically connected (e.g. soldered) to a circuit board. In one embodiment, pins 1722a can provide power and/or data to the circuit board, and pins 1727a can provide ground. In another embodiment, pins 1770 can provide power, ground, and other signals to an active optical component, such as 1660. Pins 1770 can also carry the data signal that was converted from optical to electrical, or vice versa.

Figure 17C:
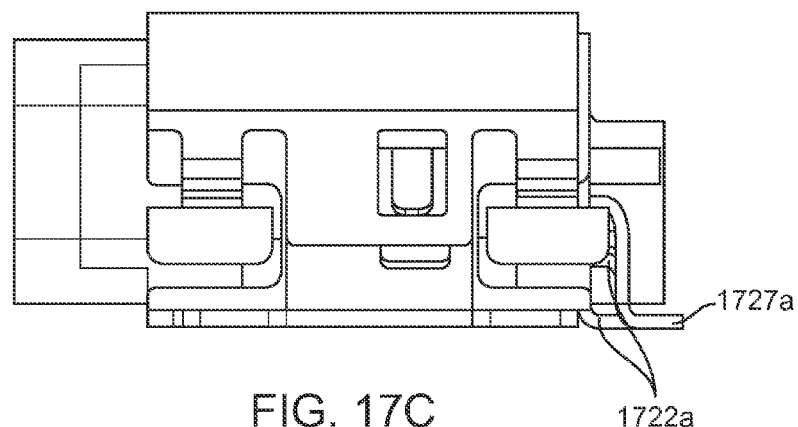

FIG. 17C is a side view of a female hybrid connector 1700 according to embodiments of the present invention. As shown, pins 1772 are at an end of the connector 1700 and flatten out for connection to a circuit board. Pins 1722a are shown coming from two locations within the connector, at a top and a bottom of the opening 1705.

As an example, suppose data signals are sent over the two contacts 1722 on top inner surface 1780, or over one contact on top inner surface 1780 and one contact on bottom inner surface 1722. In one implementation, the signal can be a differential signal. In another implementation, a signal can be sent over just one contact. In one embodiment, various signals can be sent through these data contacts at different times. This multiplexing/demultiplexing can be achieved with a circuit in the connector or on a circuit of an electronic device. The circuit can send certain signals at one point in time and then send other signals at a different point in time. Thus, instead of having certain contacts dedicated to a particular type of signal (e.g. audio or video), one contacts or pair of contacts can transmit any type of signal.

In one embodiment, both the male plug connector and the female plug connector can multiplex many signals onto one data path (connection between one or a pair of data contacts). In another embodiment, both the male plug connector and the female plug connector can demultiplex many signals from the one data path to many paths. For example, on the female connector, two contacts 1722 can receive the multiplexed data signals, and a circuit in the connector can separate the incoming signal (e.g. 1 signal demultiplexed to N signals) and provide the demultiplexed signals on pins at the back of the connector. But, this may cause the connector to still be large. Thus, the demultiplexing may occur on the circuit board that pins 1722a are connected. The optical signals may also be multiplexed in a similar fashion, for example, either with a circuit on a substrate that the active optical component is part of or by a circuit on the circuit board.

The male plug connector can also perform the demultiplexing on signals from the female connector. In one embodiment, the multiplexed N signals can be provided each over N or 2N wires in a cable to which the male plug connector is part of. For example, multiple channels of a display port signal can be sent along a single data path, either electrical or optical. The multiplexing/demultiplexing can be synchronized between the circuits of the connectors. As examples, this synchronization can occur according to a protocol (which dictates a specific timing, including a specific order, of the signals) or according to control signals which specify which data signals are following a control signal.

In one embodiment, a subassembly of pins 1770 and 1772 for one active optical component can be manufactured as a single piece. The two pieces for the active optical components can then be assembled together with an overmold. The electrical contacts could then be added into (e.g. pressed into) the overmolded insulator core. In another embodiment, each of the pins 1722, 1770, and 1772 can initially be one lead frame (e.g. attached to a carrier) to control spacing. The housing 1790 (insulator core) can be overmolded over all pins at the same time.

Figure 18:
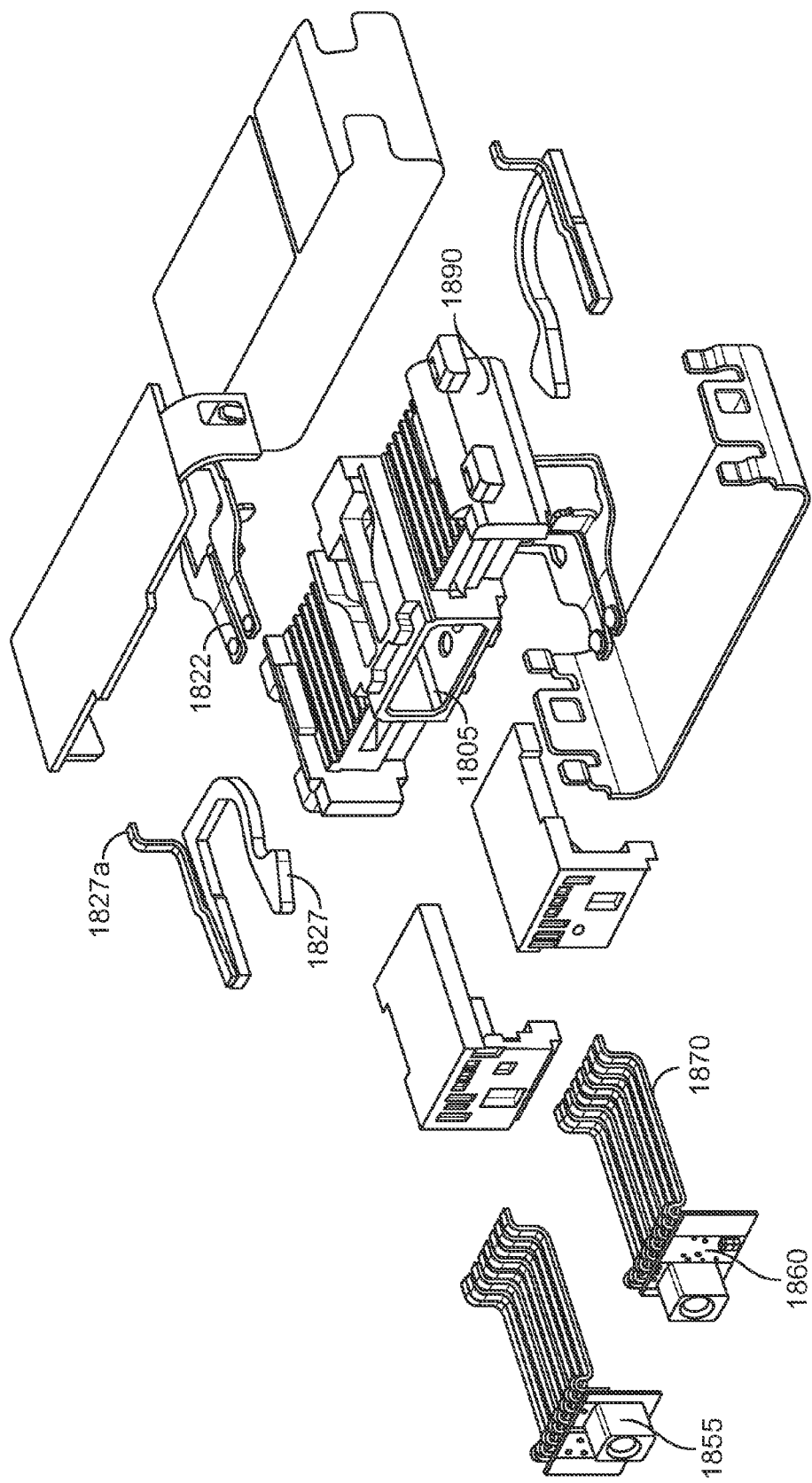
FIG. 18 shows an exploded view of a female receptacle connector according to embodiments of the present invention.

FIG. 18 shows an exploded view of a female receptacle connector according to embodiments of the present invention. Contact/pins 1822 are shown on the top and bottom inner surface of opening 1805 of housing 1890. Contacts/pins 1827 are shown on side inn surfaces of opening 1805. In one embodiment, contacts 1827 can be part of a retention mechanism, and can provide ground or other signal to pins 1827a at a tail end of the contact/pin. In another embodiment, pins 1870 are electrically coupled with the active optical component 1860 and any collector/lens combination 1855.

Figure 19A:
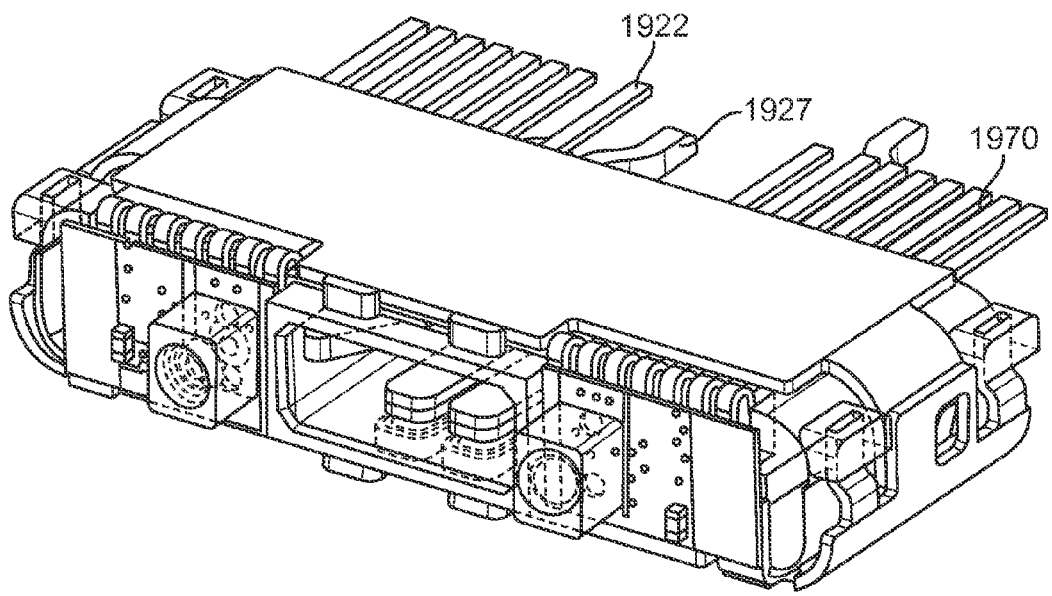
FIGS. 19A and 19B show various views of a female receptacle connector according to embodiments of the present invention.
Figure 19B:
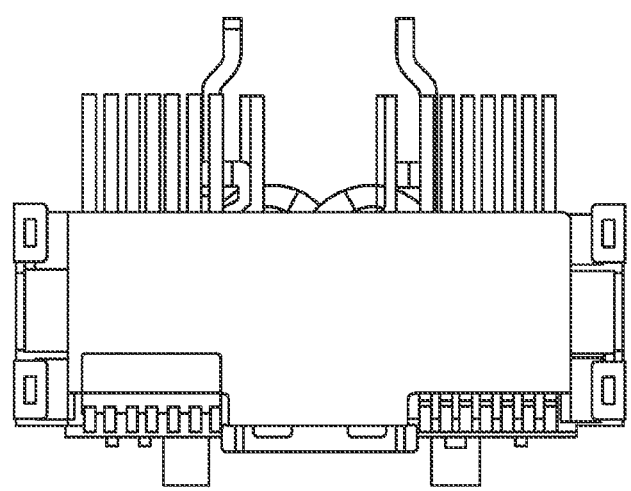

FIGS. 19A and 19B shows various views of a female receptacle connector according to embodiments of the present invention. As shown, the pins 1927 lie in a different plane than at least some of the pins 1922 and the pins 1970. In one embodiment, pins in different planes can be attached to different sides of a same circuit board.

Figure 20A:
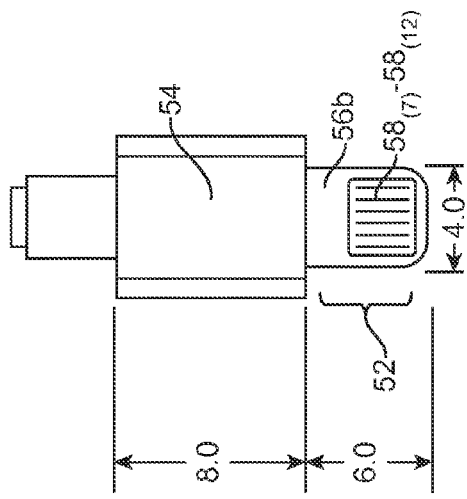
Figure 20B:
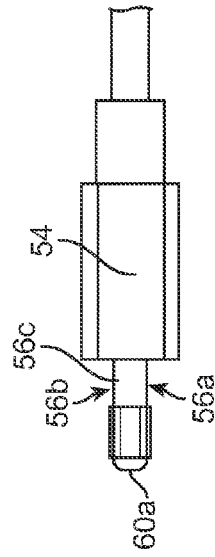
FIGS. 20B-20D are simplified bottom, front and side plan views, respectively, according to one embodiment of the present invention.
Figure 20C:
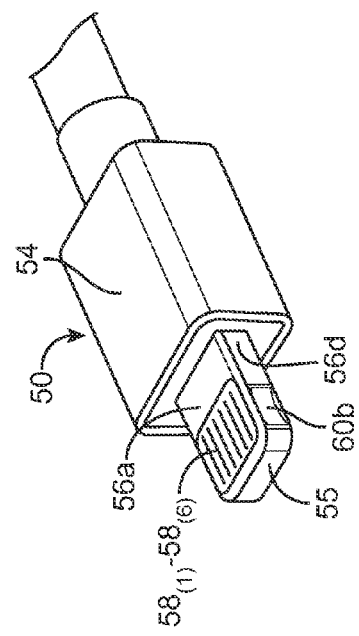
Figure 20D:
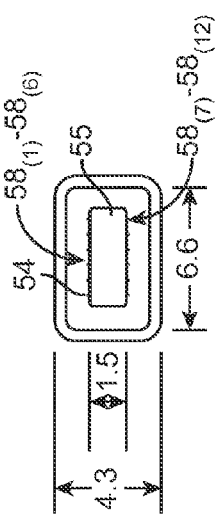

Other examples of a connector insert for a hybrid male plug connector can be found in FIGS. 20A-20D. FIG. 20A is a simplified perspective view of a connector insert for hybrid male plug connector 50, while FIGS. 20B-20D are simplified bottom, front and side plan views, respectively, according to one embodiment of the present invention. As mentioned above, any number of contacts can be one a top surface and a bottom surface, and these embodiments show six on top and six on the bottom.

As shown, connector 50 includes a tab 52 that extends from an outer shell 54 that can be made from a dielectric material such as a thermoplastic polymer and formed in an injection molding process. Tab 52 has a front major surface 56a upon which six contacts $58_{(1)}$ and $58_{(6)}$ are positioned and a back major surface 56b upon which an additional six contacts $58_{(7)}$ and $58_{(12)}$ are located. In one embodiment, spacing is consistent between each of the contacts on the front and back sides and between the contacts and the edges of the connector providing 180 degree symmetry so that plug connector 50 can be inserted into a corresponding receptacle connector in either of two orientations as discussed below.

In one aspect, a significant portion of tab 52 can be part of a ground ring 55 that extends from a distal tip of the connector towards the outer shell and partially surrounds contacts $58_{(1)}$-$58_{(12)}$ along an outer periphery of tab 52. Ground ring 55 can be made from any appropriate metal or other conductive material and in one embodiment is stainless steel plated with copper and nickel. Two indentations or pockets 60a and 60b can be formed in ground ring 55 and located on opposing sides 56c and 56d of the tab near its distal end. In operation, tab 52 can be inserted into a receptacle connector until pockets 60a and 60b operatively engage with a retention mechanism, such as a cantilevered spring or detent. The retention mechanism fits within pockets 108 and provides a retention force that secures connector 50 to the matching receptacle connector. In order for the connectors to be separated, a force greater than the retention force can be supplied in a direction that pulls the mated connectors away from each other. In other embodiments, other retention mechanisms can be used such as mechanical or magnetic latches or orthogonal insertion mechanisms.

As shown in FIGS. 20A-20D, contacts $58_{(1)}$-$58_{(12)}$ are external contacts that are positioned along an outer surface of tab 52 and connector 50 does not include an exposed cavity in which particles and debris may collect. To improve robustness and reliability, connector 50 can be fully sealed and includes no moving parts. Furthermore, connector 50 has a considerably reduced insertion depth and insertion width as compared to commonly available TRS and TRRS connectors described above. In one particular embodiment, tab 52 of connector 50 has a width, X, of 4.0 mm; a thickness, Y, of 1.5 mm; and a insertion depth, Z, of 5.0 mm. It is understood that the dimensions of connector 50 as well as the number of contacts may vary in different embodiments.

When connector 50 is properly engaged with a receptacle connector, each of contacts $58_{(1)}$-$58_{(12)}$ is in electrical contact with a corresponding contact in the receptacle connector. In one embodiment, tab 52 has a 180 degree symmetrical, double orientation design which enables the connector to be inserted into a connector jack in both a first orientation where surface 56a is facing up or a second orientation where surface 56b is facing up. Thus, connector 50 can be said to be orientation agnostic. In one embodiment, the contact order on the bottom side of the connector, from left to right, can be as follows: the first two contacts are designated for a pair of differential data signals, the third contact is designated for a power contact, the fourth contact is designated for an audio contact and the fifth and sixth contacts are designated for another pair of differential data signals. Similarly, the contact order on the bottom side of the connector, from left to right, can be as follows: the first two contacts are designated for a pair of differential data signals, the third contact is designated for an audio contact, the fourth contact is designated for a power contact and the fifth and sixth contacts are designated for another pair of differential data signals.

The specific details of particular embodiments may be combined in any suitable manner or varied from those shown and described herein without departing from the spirit and scope of embodiments of the invention.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A female receptacle connector comprising:
a front configured to mate with a corresponding connector;
an insulator core;
a plurality of pins embedded in the insulator core, wherein each pin contains an electrically conductive material, the plurality of pins comprising a first and a second set of pins, wherein front ends of the first set of pins are configured to mate with electrical contacts of the corresponding connector, wherein the insulator core includes an opening for receiving the electrical contacts of the corresponding connector;
at least one active optical component for at least one of receiving optical signals from or transmitting optical signals to the corresponding connector, wherein the second set of pins extend to a substrate that is attached to the at least one active optical component; and
a lens device extending from the at least one active optical component to the front of the connector, wherein the lens device is configured to carry optical signals to and from an optical device of the corresponding connector,
wherein at least a portion of the second set of pins are communicably coupled with the at least one active optical component and are configured to carry electrical signals corresponding to the optical signals.

2. The connector of claim 1, wherein the front ends of the first set of pins lie on at least two inner surfaces of the opening.

3. The connector of claim 2, wherein the opening has a top inner surface, a bottom inner surface, and two side inner surfaces; wherein the first set of pins comprise at least six pins, and wherein at least two pins are located on the top inner surface of the opening, at least two pins are located on the bottom inner surface of the opening, and at least one pin is located on each side inner surface of the opening.

4. The connector of claim 3, wherein the pins located on each side inner surface of the opening are configured to provide ground, at least one of the pins on the top inner or bottom inner surface is configured to carry power, and the remaining pins are configured to carry data signals and an identification signal.

5. The connector of claim 2, wherein the opening has two side inner surfaces, and wherein each side inner surface comprises a retention mechanism for engaging a side of an insert of the corresponding connector.

6. The connector of claim 5, wherein the first set of pins comprise a pin located on each side inner surface of the opening, and wherein the pins located on the side inner surfaces act as the retention mechanism by engaging notches in the sides of the insert of the corresponding connector.

7. The connector of claim 1, wherein the first set of pins extend from a circuit board to a front of the connector, and wherein the second set of pins extend from the circuit board to the substrate that is attached to the at least one active optical component.

8. The connector of claim 1, wherein the lens device includes aligning elements that receive the optical device of the corresponding connector and aligns the optical device with a lens of the lens device.

9. The connector of claim 1, wherein the at least one active optical component includes:
a laser device that receives electrical signals from a first portion of the second set of pins and that converts the received electrical signals to electromagnetic radiation.

10. The connector of claim 9, wherein the laser device includes a laser and electrical components, wherein the electrical components receive the electrical signals from the first portion of the second set of pins and generates input signals to the laser.

11. The connector of claim 9, wherein the at least one active optical component includes:
a photodiode device that receives electromagnetic radiation from the corresponding connector and that converts the received electromagnetic radiation to electrical signals on a second portion of the first set of pins.

12. The connector of claim 1, wherein the second set of pins are attached at a back of the substrate, wherein the at least one active optical component is attached to the back of the substrate, the connector further comprising:
one or more respective lens devices optically coupled to a respective one of the at least one active optical component, wherein the lens devices are at a front of the substrate, and wherein the substrate has one or more respective holes between each of the least one active optical component and the respective lens devices.

13. The connector of claim 12, wherein at least two of the pins of the second set are connected together via a plate at the end of the at least two pins, the at least two pins configured to carry ground, wherein the plate is attached to the substrate over the at least one active optical component.

* * * * *